United States Patent
Baek et al.

(10) Patent No.: US 11,626,469 B2
(45) Date of Patent: Apr. 11, 2023

(54) DISPLAY DEVICE INCLUDING METAL COMPOUND LAYER SURROUNDING WIRING LAYER STACK FOR REDUCING LIGHT REFLECTANCE

(71) Applicant: Samsung Display Co., Ltd., Yongin-si (KR)

(72) Inventors: Gyung Min Baek, Yongin-si (KR); Hyun Eok Shin, Gwacheon-si (KR); Ju Hyun Lee, Seongnam-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 94 days.

(21) Appl. No.: 17/178,288

(22) Filed: Feb. 18, 2021

(65) Prior Publication Data
US 2022/0013615 A1    Jan. 13, 2022

(30) Foreign Application Priority Data
Jul. 8, 2020 (KR) .................. 10-2020-0084180

(51) Int. Cl.
*H01L 27/32* (2006.01)
*H01L 51/56* (2006.01)

(52) U.S. Cl.
CPC .......... *H01L 27/3276* (2013.01); *H01L 51/56* (2013.01); *H01L 2227/323* (2013.01)

(58) Field of Classification Search
CPC ............. H01L 27/3276; H01L 27/3279; H01L 27/3258; H01L 51/56

USPC ............................................. 257/40
See application file for complete search history.

(56) References Cited

U.S. PATENT DOCUMENTS

| | | | |
|---|---|---|---|
| 2017/0263651 A1* | 9/2017 | Tochibayashi | ...... H01L 27/1207 |
| 2020/0026134 A1 | 1/2020 | Lee et al. | |
| 2020/0395389 A1 | 12/2020 | Lee et al. | |
| 2021/0143227 A1* | 5/2021 | Ikeda | .................. H01L 51/5218 |

FOREIGN PATENT DOCUMENTS

| | | |
|---|---|---|
| KR | 10-2019-0124838 A | 11/2019 |
| KR | 10-2020-0143607 A | 12/2020 |

OTHER PUBLICATIONS

Sheng-Hung Tu, Cyuan-Jhang Wu, Shao-Liang Cheng, Heng-Kwong Tsao, Hsing-Chen Wu, Yu-Jane Sheng, "Growing hydrophobicity on a smooth copper oxide thin film at roomtemperature and reversible wettability transition", Applied Surface Science vol. 316, Oct. 15, 2014, pp. 88-92, Taiwan, ROC, Journal homepage: https://www.elsevier.com/locate/apsusc, 0169-4332/© 2014 Elsevier B.V.

* cited by examiner

*Primary Examiner* — Matthew E. Gordon
(74) *Attorney, Agent, or Firm* — Innovation Counsel LLP

(57) ABSTRACT

A display device and a method of fabricating a display device are provided. A display device includes a substrate. The wiring layer includes a conductive metal layer and a metal compound layer of the conductive metal layer, The metal compound layer surrounds the conductive metal layer.

13 Claims, 19 Drawing Sheets

GL1: GCM1, GOM1
GL2: GCM2, GOM2
GL3: GCM3, GOM3
GL4: GOM4

DL1: DCM1, DOM1
DL2: DCM2, DOM2
DL3: DCM3, DOM3
DL4: DCM4_2, DOM4_2

DISPLAY DEVICE INCLUDING METAL COMPOUND LAYER SURROUNDING WIRING LAYER STACK FOR REDUCING LIGHT REFLECTANCE

CROSS-REFERENCE TO RELATED APPLICATION

This application claims priority to Korean Patent Application No. 10-2020-0084180 filed on Jul. 8, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device and a method of fabricating the same.

2. Description of the Related Art

The importance of display devices has steadily increased with the development of multimedia technology. Accordingly, various types of display devices such as a liquid crystal display (LCD) device, an organic light emitting display (OLED) device and the like have been used.

The display device may include a plurality of pixels representing different colors, thereby achieving color display. In order for the pixels of the display device to operate independently of one another and to represent different colors, the display device may include driving signal wirings for transferring a driving signal and various functional electrodes arranged per each pixel.

For example, the driving signal wirings require low electrical resistance, high thermal stability, and ease of manufacturing.

SUMMARY

Aspects of the present disclosure provide a display device that is capable of improving display quality by restraining or preventing wirings or the like from reflecting external light and a method of fabricating the same.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

An embodiment of a display device includes a substrate, and a wiring layer disposed on the substrate. The wiring layer includes a conductive metal layer and a metal compound layer of the conductive metal layer. The metal compound layer surrounds the conductive metal layer.

An embodiment of a display device includes a substrate, a first wiring layer disposed on the substrate and including a gate signal wiring, a first insulating layer disposed on the first wiring layer, a second wiring layer disposed on the first insulating layer and including a data signal wiring, a data pad connected to the data signal wiring, and a drain electrode spaced apart from the data signal wiring, a second insulating layer disposed on the second wiring layer, and a pixel electrode disposed on the second insulating layer and electrically connected to the drain electrode, wherein the second wiring layer includes a first conductive material and a metal compound layer which includes an oxide or a nitride of the first conductive material and is disposed on the first conductive material, wherein the metal compound layer has a reflectance lower than that of the first conductive material, and wherein the metal compound layer has a resistance higher than that of the first area.

An embodiment of a method of fabricating a display device, includes sequentially forming a first pattern layer material layer, a second pattern layer material layer, a third pattern layer material layer, and a fourth pattern layer material layer on a substrate, patterning the first pattern layer material layer, the second pattern layer material layer, the third pattern layer material layer, and the fourth pattern layer material layer using one mask, and surface treating at least a part of the patterned first pattern layer material layer, the patterned second pattern layer material layer, the patterned third pattern layer material layer, and the patterned fourth pattern layer material layer to form a wiring layer including conductive layers and metal compound layers covering a top portion and a side portion of the conductive layers, the surface treating including an oxidation or a nitridation, wherein the metal compound layers has a light reflectance lower than that of the conductive layers.

The display device and the method of fabricating the same according to an embodiment are capable of improving display quality by restraining or preventing wirings or the like from reflecting external light.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will filly convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, exemplary embodiments will be described in detail with reference to the accompanying drawings.

Figure 1:
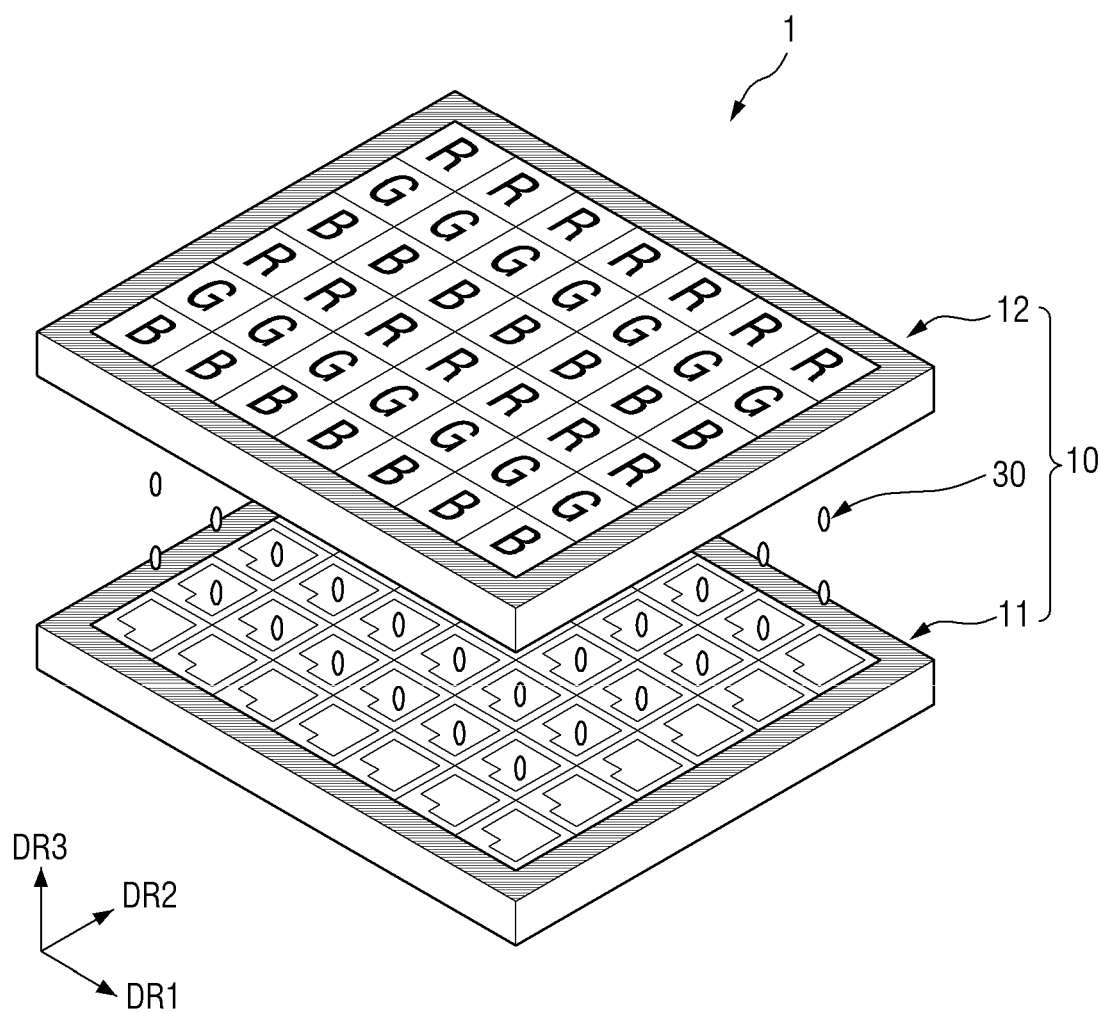
FIG. 1 is an exploded perspective view of a display device according to an embodiment.

FIG. 1 is an exploded perspective view of a display device according to an embodiment.

Referring to FIG. 1, a display device 1 according to this embodiment may include a display panel 10 including a first substrate 11, a second substrate 12, and a liquid crystal layer 30 interposed between the first and second substrates 11 and 12.

The display panel 10 may include a plurality of pixels arranged in the first and second directions DR1 and DR2 to form approximately a matrix configuration in a plan view. As used herein, the term "pixel" may mean a minimum unit which represents a single color in a plan view, and one pixel may represent a predetermined primary color. That is, a pixel may be the smallest unit which independently represents a predetermined color in the display panel 10. Examples of the primary color may include, but not limited to, red, green, and blue.

The first substrate 11 may include a pixel electrode disposed in each pixel and driving signal wirings extending along the boundaries of the pixels. The driving signal wirings may include a gate signal wiring 210 extending in a first direction DR1 and a data signal wiring 510 extending in a second direction DR2.

The second substrate 12 may include color filters disposed in each pixel and a common electrode 900 (see FIG. 3) disposed over the entire surface and facing the pixel electrodes.

The first and second substrates 11 and 12 may be bonded via a sealing member (not shown) disposed around the edges thereof. A liquid crystal layer 30 may be disposed in the space enclosed by the sealing member between the first and second substrates 11 and 12.

Although not shown in the drawing, a backlight unit may be arranged below the first substrate 11.

Hereinafter, the display panel 10 will be described in more detail with reference to FIGS. 2 and 3.

Figure 2:
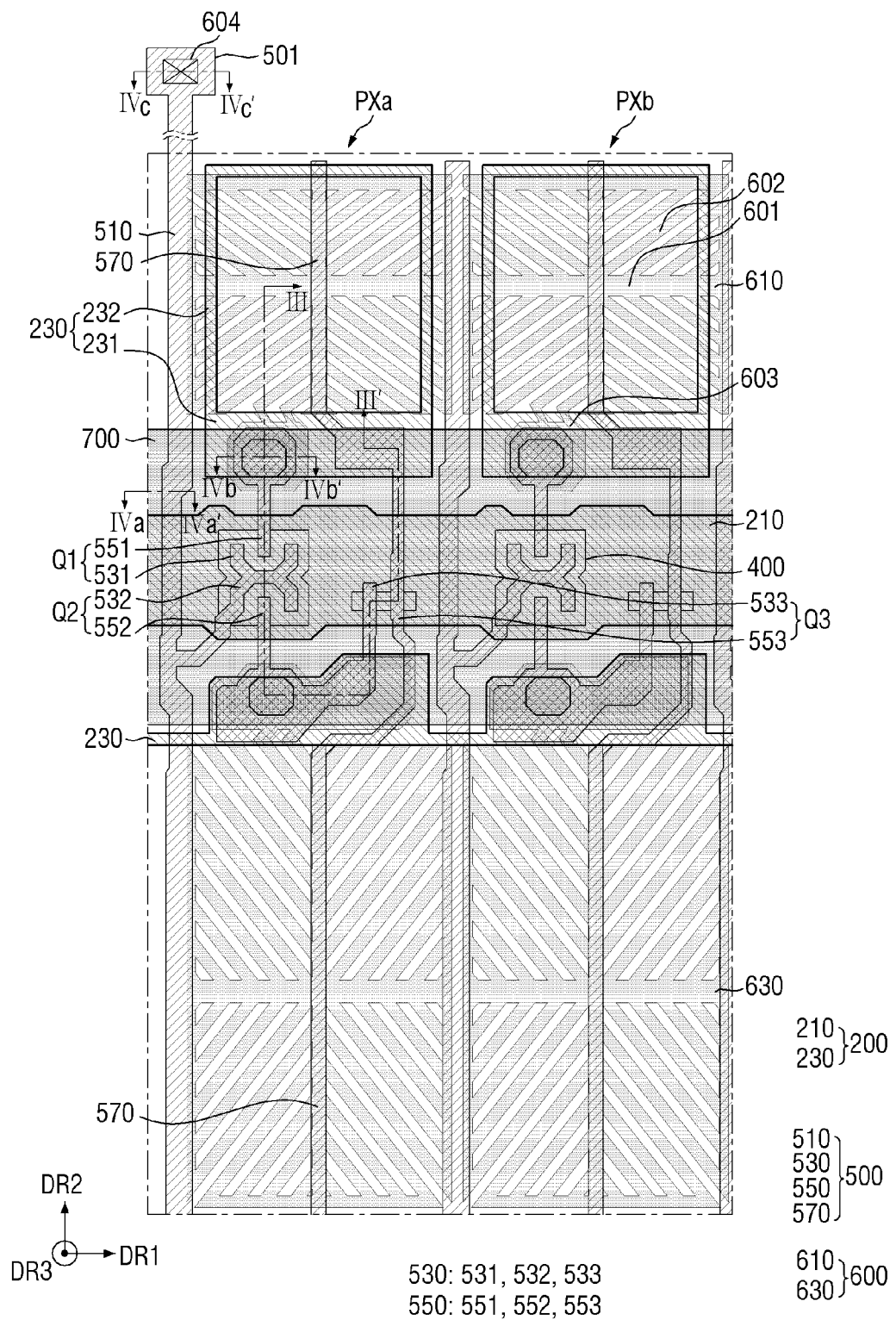
FIG. 2 is a layout view illustrating some pixels included in the display device of FIG. 1.

FIG. 2 is a layout view illustrating some pixels included in the display device of FIG. 1. In detail, FIG. 2 shows a layout of two pixels PXa and PXb adjacent in the first direction DR1 in the display device. FIG. 3 is a cross-sectional view taken along line III-III' of FIG. 2.

Figure 3:
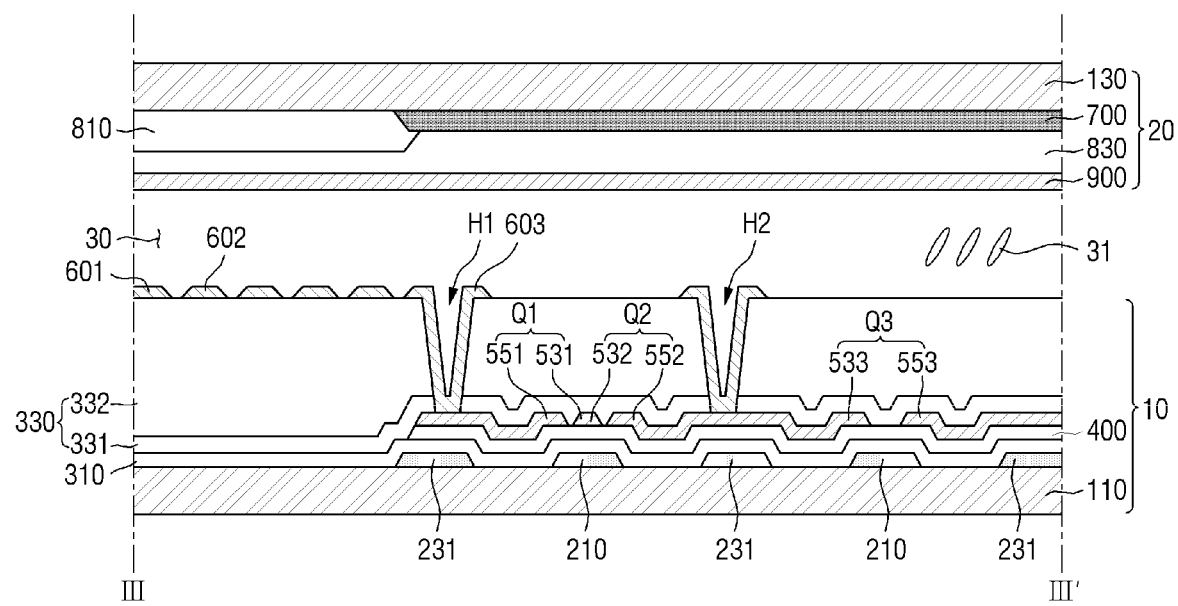
FIG. 3 is a cross-sectional view taken along line III-III' of FIG. 2.

First, referring to FIGS. 1 to 3, the first substrate 11 may include a first base 110 (or first base substrate), a first wiring layer 200, a first insulating layer 310, an active layer 400, a second wiring layer 500, a second insulating layer 330, and a pixel electrode 600. One pixel electrode 600 may include a plurality of sub-pixel electrodes 610 and 630.

The first base 110 may be a transparent insulating substrate. For example, the first base 110 may be a substrate made of a glass material, a quartz material, or a transparent plastic material. The first base 110 may be a rigid substrate. However, the first base 110 is not limited to the aforementioned examples, and the first base substrate 110 may have flexible characteristics so as to be curved, bent, folded, or rolled.

The first wiring layer 200 may be disposed on the first base 110. The first wiring layer 200 may be disposed directly on the first base 110. The first wiring layer 200 may include the gate signal wiring 210 and a sustain electrode 230. The gate signal wiring 210 and the sustain electrode 230 may be disposed on the same layer. For example, the gate signal wiring 210 and the sustain electrode 230 may be identical in structure and material with each other and may be simultaneously formed through a single process (e.g., mask process).

The gate signal wiring 210 may extend substantially along the first direction DR1. The gate signal wiring 210 may transfer a gate driving signal received from a gate driver (not shown) to switching elements in the pixels PXa and PXb. For example, the pixels PXa and PXb arranged along the first direction DR1 may share one gate signal wiring 210, but the present disclosure is not limited thereto.

A part of the gate signal wiring 210 may form a gate electrode of the switching element. For example, a part of the gate signal wiring 210 may form control terminals (or control electrodes) of a first switching element Q1, a second switching element Q2, and a third switching element Q3 to be described later. As another example, the control terminal of the switching element may be a portion of the gate signal wiring 210 which protrudes along the second direction.

The sustain electrode 230 may be arranged to overlap a part of the pixel electrode 600 and/or a part of the second wiring layer 500 to be described later. The sustain electrode 230 may form a storage capacitor in cooperation with a dielectric layer (or insulating layer) interposed between the sustain electrode 230 and the second wiring layer 500 (and/or the pixel electrode 600). The storage capacitor may serve to maintain the voltage applied to the pixel electrode 600 during a frame (or predetermined time). The sustain electrode 230 may have an extended portion to secure a required capacitance. In this case, the overlap area between the sustain electrode 230 and the pixel electrode 600 may be maximized to increase the capacitance of the storage capacitor which may maintain the voltage of the pixel electrode 600 during one frame.

In an embodiment, the sustain electrode 230 may be arranged to partially overlap the edge of the first sub-pixel electrode 610. When the first sub-pixel electrode 610 has a substantially rectangular planar shape, the sustain electrode 230 may have a substantially rectangular shape in a plan view which includes parts 231 extending in the first direction DR1 and parts 232 extending in the second direction DR2. However, the present disclosure is not limited thereto, and the sustain electrode 230 may be variously modified to form the storage capacitor with the pixel electrode 600.

The first insulating layer 310 may be disposed on the first wiring layer 200 to cover all of the surface of the first base 110. The first insulating layer 310 may include an insulating material to insulate the components disposed thereon from the components disposed therebelow. The first insulating layer 310 may be a gate insulating layer for insulating the control terminals (i.e., gate electrodes) of the first to third switching elements Q1 to Q3, to be described later, from a channel layer (i.e., active layer 400). The first insulating layer 310 may be formed of silicon nitride, silicon oxide or silicon oxynitride.

The active layer 400 may be disposed on the first insulating layer 310. The active layer 400 may include a semiconductor material. For example, the active layer 400 may include amorphous silicon or polycrystalline silicon or may include an oxide semiconductor. A part of the active layer 400 may form the channel layer of the switching elements. For example, the active layer 400 may form channels of the first switching element Q1, the second switching element Q2, and the third switching element Q3 to be described later, and the channel may be turned on or off depending on the voltage applied to the gate signal wiring 210. At least a part of the active layer 400 may extend substantially along the second direction DR2 and may be disposed to overlap the data signal wiring 510.

The second wiring layer 500 may be disposed on the active layer 400. The second wiring layer 500 includes the data signal wiring 510, a source electrode layer 530, and a drain electrode layer 530, and may further include a reference voltage wiring 570. The data signal wiring 510, the source electrode layer 530, and the drain electrode layer 530, and the reference voltage layer 570 may be arranged on the same layer. For example, the data signal wiring 510, the source electrode layer 530, and the drain electrode layer 530, and the reference voltage layer 570 may be identical in structure and material with one another and may be simultaneously formed through a single process.

The data signal wiring 510 may extend substantially along the second direction DR2. The data signal wiring 510 may transfer a data driving signal received from a data driver (not shown) to the switching element disposed in each of the pixels PXa and PXb. For example, the pixels arranged along the second direction DR2 may share one data signal wiring 510, but the present disclosure is not limited thereto.

The source electrode 530 may include a first source electrode 531, a second source electrode 532, and a third source electrode 533. The first source electrode 531, the second source electrode 532, and the third source electrode 533 may respectively serve as input terminals of the first switching element Q1, the second switching element Q2, and the third switching element Q3, respectively.

The first source electrode 531 may protrude from the data signal wiring 510 to be formed to have no physical boundary with the data signal wiring 510. That is, the first source electrode 531 may be formed integrally with the data signal wiring 510. The first source electrode 531 may be disposed to overlap the gate signal wiring 210 and the active layer 400. The first source electrode 531 may be disposed to face a first drain electrode 551 with a first channel disposed between the first source electrode 531 and the first drain electrode 551.

Similarly, the second source electrode 532 may protrude from the data signal wiring 510 to be formed to have no physical boundary with the data signal wiring 510 and the first source electrode 531. The second source electrode 532 may be disposed to overlap the gate signal wiring 210 and the active layer 400. The second source electrode 532 may be disposed to face a second drain electrode 552 with a second channel disposed between the second source electrode 532 and the second drain electrode 552.

The third source electrode 533 may extend from the second drain electrode 552 to be formed to have no physical boundary with the second drain electrode 552. The third source electrode 533 may be disposed to overlap the gate signal wiring 210 and the active layer 400. The third source electrode 533 may be disposed to face a third drain electrode 553 with a third channel disposed between the third source electrode 533 and the third drain electrode 553.

The drain electrode 550 may include the first drain electrode 551, the second drain electrode 552, and the third drain electrode 553. The first drain electrode 551, the second drain electrode 552, and the third drain electrode 553 may respectively serve as output terminals of the first switching element Q1, the second switching element Q2, and the third switching element Q3, respectively.

The first drain electrode 551 may be disposed to overlap the gate signal wiring 210 and the active layer 400. The first drain electrode 551 may be disposed to face the first source electrode 531 with the first channel disposed between the first source electrode 531 and the first drain electrode 551. The first drain electrode 551 may be electrically connected to the first sub-pixel electrode 610 through a first contact hole H1.

Similarly, the second drain electrode 552 may be disposed to overlap the gate signal wiring 210 and the active layer 400. The second drain electrode 552 may be disposed to face the second source electrode 532 with the second channel disposed between the second source electrode 532 and the second drain electrode 552. The second drain electrode 552 may be electrically connected to the second sub-pixel electrode 630 through a second contact hole H2. The second drain electrode 552 may be formed integrally with the third source electrode 533 with no physical boundary with the third source electrode 533.

The third drain electrode 553 may be disposed to overlap the gate signal wiring 210 and the active layer 400. The third drain electrode 553 may be disposed to face the third source electrode 533 with the third channel disposed between the third source electrode 533 and the third drain electrode 553.

The reference voltage wiring 570 may extend substantially in the second direction DR2. For example, a part of the reference voltage wiring 570 extending in the second direction DR2 may be disposed to overlap a stem portion 601 of the pixel electrode 600 to be described later. When the reference voltage wiring 570 overlaps the stem portion 601 of the pixel electrode 600, a decrease in luminance due to the opaque reference voltage wiring 570 which overlaps an opening area may be minimized. A reference voltage may be applied to the reference voltage wiring 570. The reference voltage is described later along with the pixel electrode 600.

In an embodiment, the reference voltage wiring 570 may partially form the third drain electrode 553. For example, the reference voltage wiring 570 may simultaneously serve as an output terminal of the third switching element Q3. However, the present disclosure is not limited thereto and, for example, the reference voltage wiring 570 and the third drain electrode 553 may be formed to be physically separated from each other and electrically connected to each other.

The second wiring layer 500 may include a metallic material to achieve low resistance. Examples of a metallic material for achieving low resistance may include copper (Cu) and titanium (Ti). Meanwhile, such metallic materials typically have a high reflectance. If the second wiring layer 500 has a high reflectance, this may degrade image quality due to reflection of external light. Accordingly, it is preferable for the second wiring layer (e.g., data signal wiring 510, source electrode layer 530, drain electrode layer 530, and reference voltage wiring 570) to have low surface reflectance and a low resistance characteristic. The layered structure of the second wiring layer 500 for achieving such characteristics is described later with reference to FIGS. 4 and 5.

The second insulating layer 330 may be disposed on the second wiring layer 500 to cover all of the surface of the first base 110. The second insulating layer 330 may include an insulating material. The second insulating layer 330 may insulate the second wiring layer 500 and the pixel electrode 600 from each other. The second insulating layer 330 may have a layered structure of a plurality of layers. For example, the second insulating layer 330 may have a double-layer structure including a protection layer 331 made of an inorganic material and a planarization layer 332 made of an organic material, but the present disclosure is not limited thereto.

The second insulating layer 330 may have contact holes formed therein. For example, the first contact hole H1 may be formed in the second insulating layer 330 to partially expose the first drain electrode 551, and the second contact hole H2 may be formed in the second insulating layer 330 to partially expose the second drain electrode 552.

The pixel electrode 600 may be disposed on the second insulating layer 330. The pixel electrode 600 may generate an electric field in the liquid crystal layer 30 in cooperation with the common electrode 900 to be described later to control orientations of liquid crystals 31 in the pixel. The pixel electrode 600 may be arranged for each of the pixels PXa and PXb, and an independent voltage may be applied to the pixel electrode 600. The pixel electrode 600 may be a transparent electrode made of a transparent conductive material. Examples of the material for forming the transparent electrode may include indium tin oxide (ITO) and indium zinc oxide (IZO).

In an embodiment, the pixel electrode 600 in one pixel may include the first sub-pixel electrode 610 and the second sub-pixel electrode 630 separated from each other. An area occupied by the first sub-pixel electrode 610 may be less than an area occupied by the second sub-pixel electrode 630 in a plan view.

The first and second sub-pixel electrodes 610 and 630 may each have a substantially quadrilateral shape in a plan view and may be patterned electrodes having a domain dividing means. For example, the first and second sub-pixel electrodes 610 and 630 may each include a stem portion 601, a plurality of branch portions 602 extending from the stem portion 601, and a connection portion 603 extending from the branch portions 602.

The stem portion 601 may have an approximately cross shape. The stem portion 601 may overlap the reference voltage wiring 570 extending substantially in the second direction DR2. The branch portions 602 may extend radially from a center of each of the first sub-pixel electrode 610 and the second sub-pixel electrode 630 in an oblique direction, e.g., a direction making an angle of about 45 degrees with respect to the direction in which the stem portion 601 extends. That is, the plurality of branch portions 602 may extend from the stem portion 601 to form four domains having different extending directions from the stem portions 601. Such a configuration is capable of improving liquid crystal control, viewing angle, brightness, and response speed of the display device 1.

The connection portion 603 of the first sub-pixel electrode 610 may electrically connect the first sub-pixel electrode 610 to the first drain electrode 551 through the first contact hole H1, and the connection portion 603 of the second sub-pixel electrode 630 may electrically connect the second sub-pixel electrode 630 to the second drain electrode 552 through the second contact hole H2.

As described above, the first switching element Q1, the second switching element Q2, and the third switching element Q3 may share one gate signal wiring 210 so as to be simultaneously controlled. A data voltage supplied from the data signal wiring 510 through the first switching element Q1 may be applied to the first sub-pixel electrode 610. Because the second drain electrode 552 of the second switching element Q2 is electrically connected to the reference voltage wiring 570 via the third switching element Q3, a voltage having a magnitude between the data voltage supplied from the data signal wiring 510 and the reference voltage supplied from the reference voltage wiring 570 may be applied to the second sub-pixel electrode 630. Accordingly, a voltage having a relatively small magnitude compared to that applied to the first sub-pixel electrode 610 may be applied to the second sub-pixel electrode 630. By applying different voltages to the first and second sub-pixel electrodes 610 and 630, respectively, it may be possible to improve side visibility of the display device 1.

Meanwhile, although it is exemplarily shown in FIG. 2 that the edge of the first sub-pixel electrode 610 overlaps the sustain electrode 230, the present disclosure is not limited thereto. For example, it may be possible that the edge of the second sub-pixel electrode 630 overlaps the sustain electrode 230. As another example, both the first and second sub-pixel electrodes 610 and 620 may overlap the sustain electrode 230.

Hereinafter, the second substrate 12 will be described.

The second substrate 12 may include a second base 130, a light blocking member 700 disposed on one surface (bottom surface in the drawing) of the second base 130 facing the first base 110, a color filter 810 disposed on the light blocking member 700, an overcoat layer 830 disposed on the color filter 810, and a common electrode 900 disposed on the overcoat layer 830.

Similar to the first base 110, the second base 130 may be a transparent substrate. The first and second bases 110 and 130 may be made of the same material or different materials.

The light blocking member 700 may be disposed on the second base 130. The light blocking member 700 may be made of a material capable of blocking penetration of light of a visible light wavelength band. The light blocking member 700 may be arranged to overlap the first switching element Q1, the second switching element Q2, and the third switching element Q3 to prevent a light leakage defect from occurring at an unintended area.

The light blocking member 700 may have a shape of a line extending in the first direction DR1 and overlap the first to third switching elements Q1 to Q3. The light blocking member 700 may also be arranged to partially overlap the sustain electrode 230, the active layer 400, and the data signal wiring 510. The light blocking member 700 may completely overlap the gate signal wiring 210. That is, the gate signal wiring 210 may be completely covered by the light blocking member 700. Although it is shown in FIG. 2 that the light blocking member 700 is disposed on the second substrate 12, the present disclosure is not limited thereto. For example, the light blocking member 700 may be disposed on the first substrate 11. As another example, the light blocking member 700 may be omitted.

The color filter 810 may be arranged on the light blocking member 700 to overlap the pixel electrode 600. The color filter 810 may include a colorant material such as a dye or pigment. The colorant material may selectively absorb incident light of only a predetermined wavelength band. The color filter 810 may absorb incident light of a predetermined wavelength band and selectively pass light of a different predetermined wavelength band therethrough.

The overcoat layer 830 may be disposed on the color filter 810 to cover all of the surface of the second base 130. The overcoat layer 830 may planarize the plurality of components disposed on the second base 130 to provide a flat surface for disposing the common electrode 900 thereon.

The common electrode 900 may be disposed on the overcoat layer 830. The common electrode 900 may be formed in an integral manner without distinction between the pixels PXa and PXb, and a common voltage may be applied to the common electrode 900. The common electrode 900 may be a transparent electrode like the pixel electrode 600.

Next, the liquid crystal layer 30 will be described.

The liquid crystal layer 30 may include liquid crystals 31 pretilted to a predetermined direction. For example, the liquid crystals 31 may have a negative permittivity anisotropy so as to be vertically oriented in an initially oriented state. The liquid crystals 31 may have a predetermined pretilt angle in the initially oriented state. If an electric field is generated between the pixel electrode 600 and the common electrode 900, the liquid crystals 31 may tilt in a specific direction to change a polarization state of light passing through the liquid crystal layer 30. As another example, the liquid crystals 31 may have a positive permittivity anisotropy so as to be horizontally oriented in the initially oriented state and, if the electric field is generated, rotate to change the polarization state of the light.

Hereinafter, the second wiring layer 500 having a low resistance characteristic and capable of reducing external light reflection will be described with reference to FIGS. 4 and 5.

Figure 4:
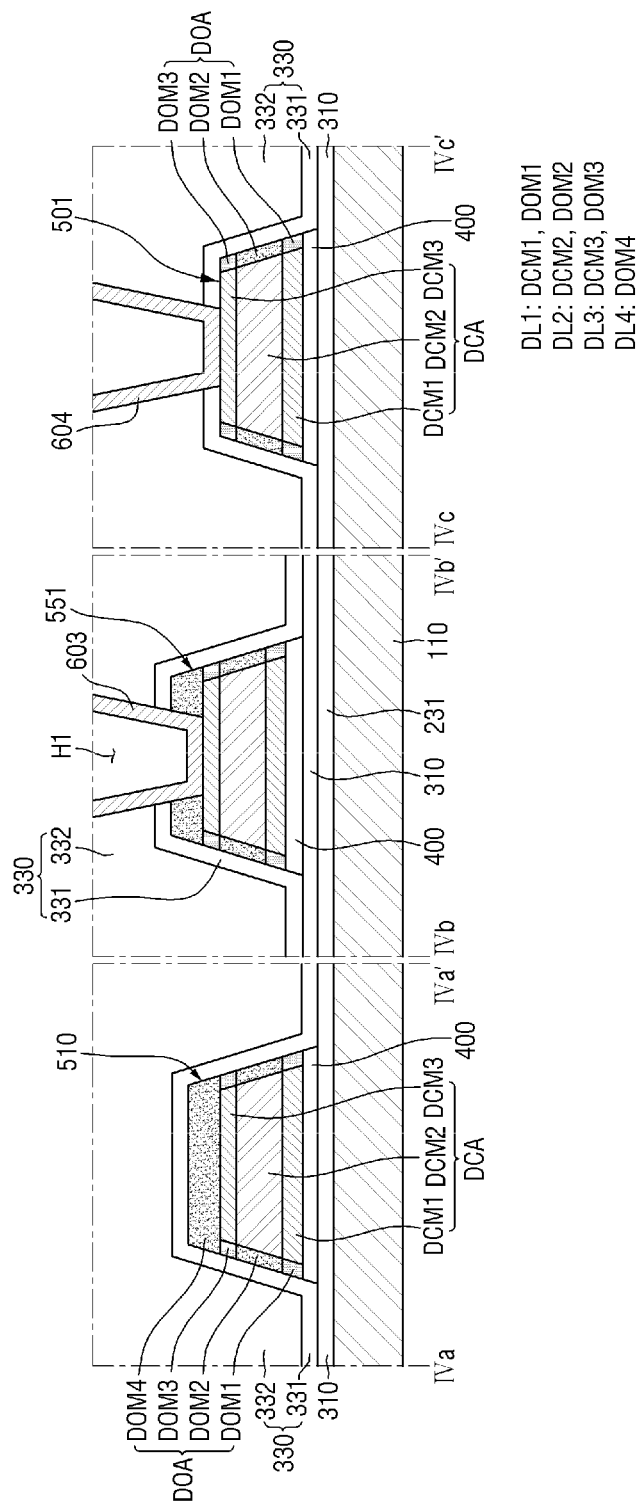
FIG. 4 is a cross-sectional view taken along lines IVa-IVa', IVb-IVb', and IVc-IVc' of FIG. 2.

FIG. 4 is a cross-sectional view taken along lines IVa-IVa', IVb-IVb', and IVc-IVc' of FIG. 2. FIG. 5 is a graph illustrating an example of a light reflectance in a visible light wavelength band in accordance with a thickness of a fourth metal oxide layer included in the second signal wiring of FIG. 4.

Referring to FIG. 4, the cross section taken along line IVa-IVa' shows the cross section of the data signal wiring 510, the cross section taken along line IVb-IVb' shows the cross section of the first contact hole H1, and the cross section taken along line IVc-IVc' shows the cross section of a data pad 501. In FIG. 4, the data signal wiring 510 and the first drain electrode 551 are shown in an enlarged view in comparison with the data signal wiring 510 and the first drain electrode 551 of FIG. 3. Meanwhile, in the graph of FIG. 5, an X-axis represents the thickness of the fourth metal oxide layer, and a Y-axis represents the reflectance.

Although the following description of the second wiring layer 500 is made with the example of the data signal wiring 510, the present disclosure is not limited thereto, and the description may be applicable to all of the source electrode layer 530, the drain electrode layer 550, and the reference voltage wiring 570 included in the second wiring layer 500. In addition, the second wiring layer 500 may further include the data pad 501, and description of the data signal wiring 510 may be applicable to the data pad 501.

The data signal wiring 510 may include a first area DCA (hereinafter, referred to as conductive area) and a second area DOA (hereinafter, referred to as oxidized area) that differ in electrical conductivity and light reflectance. The oxidized area DOA may cover the conductive area DCA. The oxidized area DOA may be disposed on the conductive area DCA to cover at least a part of the top surface and/or at least a part of the side surface of the conductive area DCA.

The oxidized area DOA may have a light reflectance lower than that of the conductive area DCA. The light reflectance of the oxidized area DOA may be in the range of 20% to 25% or 15% to 30% of the light reflectance of the conductive area DCA, although not limited thereto. The conductive area DCA may also have an electrical conductivity greater than that of the oxidized area DOA. The conductive area DCA may be a low resistance area having a resistance lower than that of the oxidized area DOA, and the oxidized area DOA may be a high resistance area having a resistance higher than that of the conductive area DCA.

Accordingly, because the oxidized area DOA is arranged to cover the top and side surfaces of the conductive area DCA, the external light reflectance of the data signal wiring 510 may decrease. In addition, the data signal wiring 510 may include the oxidized area DOA to reduce the external light reflectance, and also include the conductive area DCA with a high electrical conductivity so as to facilitate transfer of the data signal received from the driver (not shown). That is, as the data signal wiring 510 includes the conductive area DCA and the oxidized area DOA, it may be possible to reduce the external light reflectance while maintaining the high electrical conductivity.

However, the oxidized area DOA may expose at least a part of the conductive area DCA at a contact area where the second wiring layer 500 contacts another conductive layer such that the conductive area DCA exposed by the contact area and the another conductive layer (e.g., pixel electrode 600) may physically and/or electrically contact each other. In this case, the another conductive layer may directly contact the conductive area DCA of the second wiring layer 500 in the contact area, which facilitates contact between two components. The contact area may have another component disposed thereon to overlap the contact area and, even though the external light is reflected in the contact area, it may not be visually perceived from the outside due to the another component. In this respect, it may be possible to remove a part of the oxidized area DOA covering the conductive area DCA to expose the conductive area DCA for contact.

The conductive area DCA may include a first conductive metal layer DCM1, a second conductive metal layer DCM2, and a third conductive metal layer DCM3. The first conductive metal layer DCM1, the second conductive metal layer DCM2, and the third conductive metal layer DCM3 may each include a metal and have an electrical conductivity higher than that of metal oxide layers DOM1, DOM2, DOM3, and DOM4 disposed in the oxidized area DOA. Further, the first conductive metal layer DCM1, the second conductive metal layer DCM2, and the third conductive metal layer DCM3 may each have light reflectance higher than that of the metal oxide layers DOM1, DOM2, DOM3, and DOM4 disposed in the oxidized area DOA.

The first conductive metal layer DCM1 may be disposed on the active layer 400, the second conductive metal layer DCM2 may be disposed on the first conductive metal layer DCM1, and the third conductive metal layer DCM3 may be disposed on the second conductive metal layer DCM2. That is, the second conductive metal layer DCM2 may be disposed between the first and third conductive metal layers DCM1 and DCM3.

The first conductive metal layer DCM1, the second conductive metal layer DCM2, and the third conductive metal layer DCM3 may have substantially identical shape and overlap one another in a plan view. In FIG. 4, the first conductive metal layer DCM1, the second conductive metal layer DCM2, and the third conductive metal layer DCM3 have a slanted side surface. However, the side surface of the first conductive metal layer DCM1, the side surface of the second conductive metal layer DCM2, and the side surface of the third conductive metal layer DCM3 may be aligned with one another. The side surface of the first conductive metal layer DCM1, the side surface of the second conductive metal layer DCM2, and the side surface of the third conductive metal layer DCM3 may lie on the same line which extends substantially perpendicular to the first base 110.

The first and third conductive metal layers DCM1 and DCM3 may include the same metal, and the second conductive metal layer DCM2 may include a metal different from that included in the first and third conductive metal layers DCM1 and DCM3. For example, the first and third conductive metal layers DCM1 and DCM3 may include titanium (Ti), and the second conductive metal layer DCM2 may include copper (Cu), although not limited thereto.

For example, the first conductive metal layer DCM1 may have a thickness in the range equal to or less than 30 nm, the second conductive metal layer DCM2 may have a thickness in the range equal to or greater than 300 nm, and the third conductive metal layer DCM3 may have a thickness in the range equal to or less than 50 nm, although not limited thereto.

The oxidized area DOA may include a first metal oxide layer DOM1, a second metal oxide layer DOM2, a third metal oxide layer DOM3, and a fourth metal oxide layer DOM4. The first metal oxide layer DOM1, the second metal oxide layer DOM2, the third metal oxide layer DOM3, and the fourth metal oxide layer DOM4 may have a lower light reflectance and a lower electrical conductivity than those of the first to third conductive metal layers DCM1, DCM2, and DCM3 disposed in the conductive area DCA.

The first metal oxide layer DOM1 may be disposed on the active layer 400, the second metal oxide layer DOM2 may be disposed on the first metal oxide layer DOM1, and the third metal oxide layer DOM3 may be disposed on the second metal oxide layer DOM2. The second metal oxide layer DOM2 may be disposed between the first and third metal oxide layers DOM1 and DOM3.

The first metal oxide layer DOM1 may be disposed on the side surface of the first conductive metal layer DCM1, the second metal oxide layer DOM2 may be disposed on the side surface of the second conductive metal layer DCM2, and the third metal oxide layer DOM3 may be disposed on the side surface of the third conductive metal layer DCM3. That is, the first metal oxide layer DOM1 may cover at least a part of the side surface of the first conductive metal layer DCM1, the second metal oxide layer DOM2 may cover at least a part of the side surface of the second conductive metal layer DCM2, and the third metal oxide layer DOM3 may cover at least a part of the side surface of the third conductive metal layer DCM3.

The first metal oxide layer DOM1, the second metal oxide layer DOM2, and the third metal oxide layer DOM3 may have substantially identical shape and overlap one another in a plan view. In FIG. 4, the first metal oxide layer DOM1, the second metal oxide layer DOM2, and the third metal oxide layer DOM3 have a slanted side surface. However, the side surface of the first metal oxide layer DOM1, the side surface of the second metal oxide layer DOM2, and the side surface of the third metal oxide layer DOM3 may be aligned with one another. The side surface of the first metal oxide layer DOM1, the side surface of the second metal oxide layer DOM2, and the side surface of the third metal oxide layer DOM3 may lie on the same line which extends substantially perpendicular to the first base 110.

The fourth metal oxide layer DOM4 may be disposed on the third metal oxide layer DOM3 and the third conductive metal layer DCM3. The fourth metal oxide layer DOM4 may cover the top surface of the third conductive metal layer DCM3. The side surface of the fourth metal oxide layer DOM4 may be aligned with the side surface of the first metal oxide layer DOM1, the side surface of the second metal oxide layer DOM2, and the side surface of the third metal oxide layer DOM3. In FIG. 4, the fourth metal oxide layer DOM4 has a slanted side surface. However, the side surface of the fourth metal oxide layer DOM4 may lie on the same line which extends substantially perpendicular to the first base 110 as the side surface of the first metal oxide layer DOM1, the side surface of the second metal oxide layer DOM2, and the side surface of the third metal oxide layer DOM3.

The fourth metal oxide layer DOM4 may overlap the first conductive metal layer DCM1, the second conductive metal layer DCM2, and the third conductive metal layer DCM3 as well as the first metal oxide layer DOM1, the second metal oxide layer DOM2, and the third metal oxide layer DOM3 in a plan view. However, the fourth metal oxide layer DOM4 may not overlap the first metal oxide layer DOM1 and the second metal oxide layer DOM2 in a plan view.

The first metal oxide layer DOM1, the second metal oxide layer DOM2, and the third metal oxide layer DOM3 may be equal in thickness (length in a direction perpendicular to the side surface of each metal oxide layer), but the present disclosure is not limited thereto. Further, the thickness of each of the first metal oxide layer DOM1, the second metal oxide layer DOM2, and the third metal oxide layer DOM3 may be equal to the thickness (length in the thickness direction (third direction DR3)) of the fourth metal oxide layer DOM4, but the present disclosure is not limited thereto. The thicknesses of the metal oxide layers DOM1, DOM2, DOM3, and DOM4 may be different from each other or partially identical with each other.

The first metal oxide layer DOM1, the second metal oxide layer DOM2, the third metal oxide layer DOM3, and the fourth metal oxide layer DOM4 may include a metal oxide. The first and third metal oxide layers DOM1 and DOM3 may include the same material, and the second and fourth metal oxide layers DOM2 and DOM4 may include the same material. The first and third metal oxide layers DOM1 and DOM3 may include a material different from that included in the second and fourth metal oxide layer DOM2 and DOM4. For example, the first and third metal oxide layers DOM1 and DOM3 may include titanium oxide (TiOx), and the second and fourth metal oxide layers DOM2 and DOM4 may include copper oxide (CuOx), although not limited thereto.

The data signal wiring 510 may include a plurality of layers. The data signal wiring 510 may include, for example, a first pattern layer DL1, a second pattern layer DL2, a third pattern layer DL3, and a fourth pattern layer DL4. The first pattern layer DL1, the second pattern layer DL2, the third pattern layer DL3, and the fourth pattern layer DL4 may be sequentially disposed on the first base 110.

The first pattern layer DL1 may include the first conductive metal layer DCM1 and the first metal oxide layer DOM1. The first metal oxide layer DOM1 may surround the first conductive metal layer DCM1. The second pattern layer DL2 may include the second conductive metal layer DCM2 and the second metal oxide layer DOM2. The second metal oxide layer DOM2 may surround the second conductive metal layer DCM2. The third pattern layer DL3 may include the third conductive metal layer DCM3 and the third metal oxide layer DOM3. The third metal oxide layer DOM3 may surround the third conductive metal layer DCM3.

The first conductive metal layer DCM1 and the first metal oxide layers DOM1 may include the same metal, the second conductive metal layers DCM2 and the second metal oxide layer DOM2 may include the same metal, and the third conductive metal layers DCM3 and the third metal oxide layer DOM3 may include the same metal. The first to third metal oxide layers DOM1, DOM2, and DOM3 may further include a metal compound.

For example, the first conductive metal layer DCM1 and the first metal oxide layer DOM1 may include titanium (Ti), and the first metal oxide layer DOM1 may further include titanium oxide (TiOx), although not limited thereto. The second conductive metal layer DCM2 and the second metal oxide layer DOM2 may include copper (Cu), and the second metal oxide DOM2 may further include copper oxide (CuOx). The third conductive metal layer DCM3 and the third metal oxide layer DOM3 may include titanium (Ti), and the third metal oxide DOM3 may further include titanium oxide (TiOx).

The fourth pattern layer DL4 may include the fourth metal oxide layer DOM4. The fourth metal oxide layer DOM4 may cover the top surface of the third conductive metal layer DCM3, but may expose, at part thereof, the top surface of the third conductive metal layer DCM3.

For example, when the first drain electrode 551 and the connection portion 603 are electrically and/or physically connected to each other through the first contact hole H1, the fourth metal oxide layer DOM4 exposes a part of the third conductive metal layer DCM3 such that the connection portion 603 may directly contact the third conductive metal layer DCM3 of the first drain electrode 551 through the exposed area. That is, the fourth metal oxide layer DOM4 may include the first contact hole H1.

In addition, the data pad 501 may expose the third conductive metal layer DCM3. That is, the data pad 501 may not include the fourth metal oxide layer DOM4. That is, the fourth metal oxide layer DOM4 may not be disposed in the area where the data pad 501 is located. However, the present disclosure is not limited thereto, and the data pad 501, like the first drain electrode 551, may include the fourth metal oxide layer DOM4 while exposing a part of the third conductive metal layer DCM3. The pixel electrode 600 may further include a data pad connection electrode 604, which may directly contact the third conductive metal layer DCM3 of the data pad 501. The data pad connection electrode 604 may receive a data signal from the data driver and transfer the data signal to the data signal wiring 510.

The data signal wiring 510 may include the conductive metal layers DCM1 to DCM3 and the metal oxide layers DOM1 to DOM4, and the metal oxide layers DOM1 to DOM4 may cover the conductive metal layers DCM1 to DCM3 to reduce the external light reflectance of the data signal wiring 510. Furthermore, this may also be possible to reduce the external light reflectance of the second wiring layer 500 so as to improve the display quality of the display device. In addition, as the metal oxide layers DOM1 to DOM4 cover the side surfaces as well as the top surfaces of the conductive metal layers DCM1 to DCM3, it may be possible to reduce the external light reflectance of the second wiring layer 500 independently of the viewing angle, which may lead to further improvement of the display quality of the display device.

Figure 5:
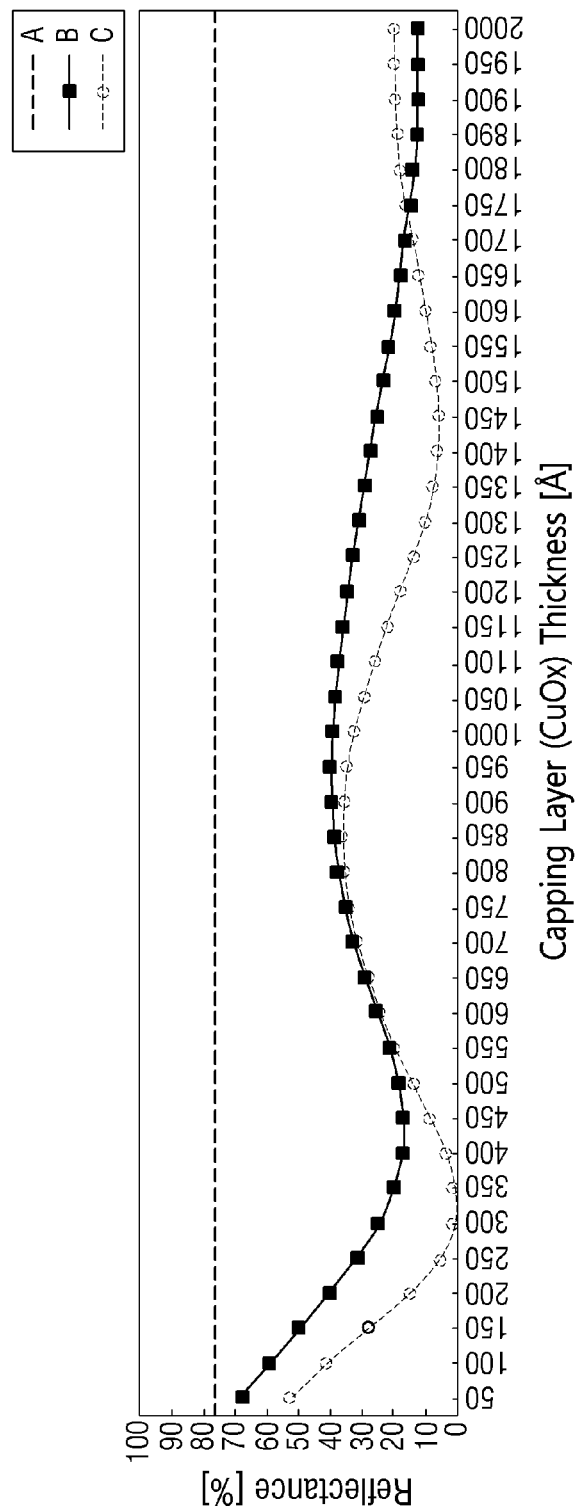
FIG. 5 is a graph illustrating an example of a light reflectance in a visible light wavelength band in accordance with a thickness of a fourth metal oxide layer included in the second signal wiring of FIG. 4.

Referring to FIG. 5, line A refers to the reflectance when the second signal wiring 500 does not include the metal oxide layers DOM1 to DOM4, line B refers to the average reflectance of light of a visual light spectrum wavelength when the second wiring layer 500 includes the metal oxide layers DOM1 to DOM4, and line C refers to the reflectance of light of a wavelength of 550 nm when the second wiring layer 500 includes the metal oxide layers DOM1 to DOM4. Comparing lines B and C with line A, it can be seen that the external light reflectance decreases when the metal oxide layers are disposed on the top and side surfaces of the second wiring layer 500.

In detail, it can be seen that the second wiring layer 500 reflects 77% of the external light in the case of line A while, in the cases of lines B and C, the external light reflectance of the second wiring layer 500 is in the range of 20% to 15%, or 18%. That is, as in the cases of lines B and C, when the second wiring layer 500 includes the oxidized area DOA, this may dramatically reduce the external light reflectance.

Hereinafter, a method of fabricating a display device will be described with reference to FIGS. 6 to 9.

FIGS. 6 to 9 are cross-sectional views illustrating a method of fabricating a display device according to an embodiment.

Figure 6:
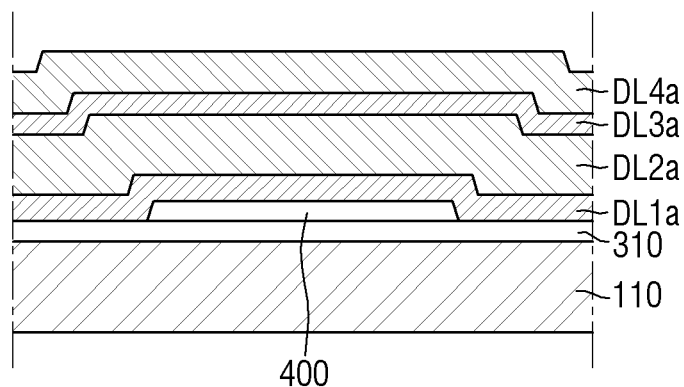
FIGS. 6, 7, 8 and 9 are cross-sectional views illustrating a method of fabricating a display device according to an embodiment.

First, referring to FIG. 6, a first pattern layer material layer DL1a, a second pattern layer material layer DL2a, a third pattern layer material layer DL3a, and a fourth pattern layer material layer DL4a are sequentially deposited on the first base 110. The pattern layer material layers DL1a, DL2a, DL3a, and DL4a may each be deposited to cover all of the surface of the first base 110. The pattern layer material layers DL1a, DL2a, DL3a, and DL4a may each be deposited in a sputtering manner, but the present disclosure is not limited thereto.

The first pattern layer material layer DL1a and the third pattern layer material layer DL3a may include the same metal, and the second pattern layer material layer DL2a and the fourth pattern layer material layer DL4a may include the same metal. The first and third pattern layer material layers DL1a and DL3a and the second and fourth pattern layer material layers DL2a and DL4a may include different metals. For example, the first and third pattern layer material layers DL1a and DL3a may include titanium (Ti) while the second and fourth pattern layer material layers DL2a and DL4a may include copper (Cu), although not limited thereto.

Before the pattern layer material layers DL1a, DL2a, DL3a, and DL4a are deposited, the first wiring layer 200, the first insulating layer 310, and the active layer 400 may be formed. The pattern layer material layers DL1a, DL2a, DL3a, and DL4a may each cover the active layer 400 and may be deposited on the first wiring layer 200, the first insulating layer 310, and the active layer 400. The methods for fabricating the first wiring layer 200, the first insulating layer 310, and the active layer 400 are well-known techniques and thus detailed descriptions thereof are omitted hereinbelow.

Figure 7:
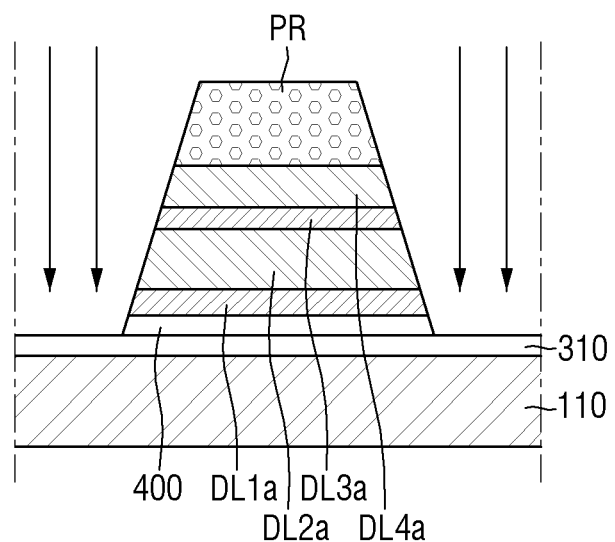

Next, referring to FIG. 7, the first pattern layer material layer DL1a, the second pattern layer material layer DL2a, the third pattern layer material layer DL3a, and the fourth pattern layer material layer DL4a which are deposited to cover all of the first base 110 are patterned.

In detail, the pattern layer material layers DL1a, DL2a, DL3a, and DL4a may be patterned using one mask process. It is carried out by coating a photoresist layer on the pattern layer material layers DL1a, DL2a, DL3a, and DL4a, forming a photoresist pattern PR by exposing a part of the photoresist layer through exposure and development processes, and etching each of the pattern layer material layers DL1a, DL2a, DL3a, and DL4a by using the photoresist pattern PR as an etching mask. Next, the photoresist pattern is removed through a strip or ashing process to form a pattern that has a substantially identical shape in a plan view with the second wiring layer 500 as shown in FIGS. 2 to 4. The method of etching each of the pattern layer material layers DL1a, DL2a, DL3a, and DL4a may be an isotropic etching or an anisotropic etching. When using the isotropic etching, the side surface of the patterned pattern layer material layers DL1a, DL2a, DL3a, and DL4a may have a slated angle. When using the anisotropic etching, the side surface of the patterned pattern layer material layers DL1a, DL2a, DL3a, and DL4a may be disposed on the same line which extends perpendicular to the first base 110.

The first to fourth pattern layer material layers DL1a, DL2a, DL3a, and DL4a of the second wiring layer 500 as shown in FIGS. 2 to 4 may be patterned using one mask. In addition, although not shown in the drawing, the active layer 400 may be patterned at the same time when the first to fourth pattern layer material layers DL1a, DL2a, DL3a, and DL4a of the second wiring layer 500 is patterned using the same as the mask for use in patterning the respective pattern layer material layers DL1a, DL2a, DL3a, and DL4a and, in this case, the pattern layer material layers DL1a, DL2a, DL3a, and DL4a and the active layer 400 may be formed to have a substantially identical shape in a plan view.

Figure 8:
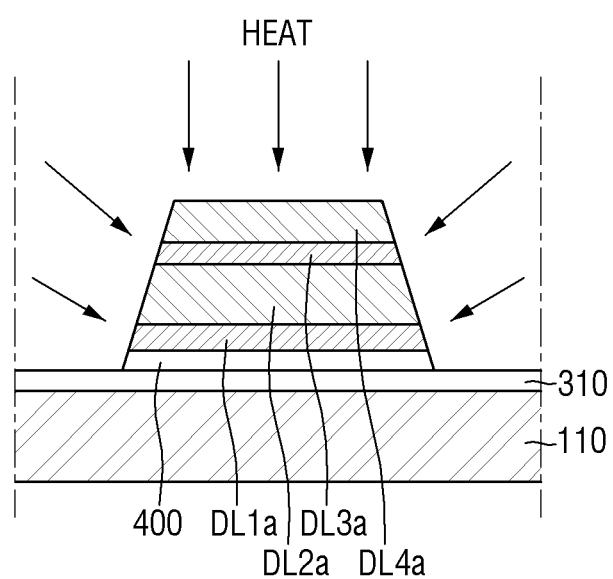
Figure 9:
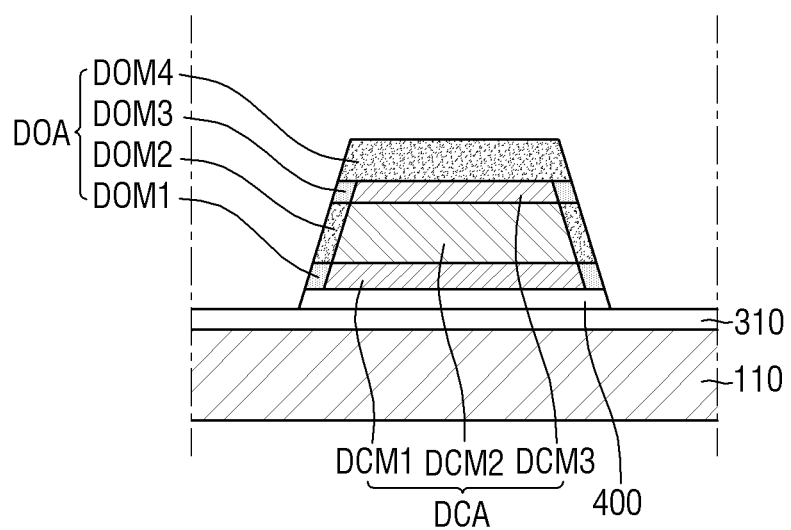

Next, referring to FIGS. 8 and 9, the patterned pattern layer material layers DL1a, DL2a, DL3a, and DL4a are oxidized to completely form the second wiring layer 500 having the conductive area DCA and the oxidized area DOA as shown in FIGS. 2 to 4.

In detail, the patterned pattern layer material layers DL1a, DL2a, DL3a, and DL4a may be partially oxidized by being exposed to a high temperature through a heat treatment process. The heat treatment process may be carried out with oxygen gas. That is, the pattern layer material layers DL1a, DL2a, DL3a, and DL4a may each be exposed to a high temperature in an atmosphere containing the oxygen gas.

As the heat treatment process progresses, the oxygen is provided from the outside, and the oxidation may start at exposed parts of the patterned pattern layer material layers DL1a, DL2a, DL3a, DL4a and 400. As the oxidation progresses, the second wiring layer 500 including the oxidized area DOA which covers exposed surfaces of the respective pattern layer material layers DL1a, DL2a, DL3a, and DL4a and the conductive area DCA covered by the oxidized area DOA may be completely formed. During the oxidation process, exposed side surface of the active layer 400 may also be oxidized to form an oxide layer on the side surface of the active layer 400.

The exposed surface of the patterned first to third pattern layer material layers DL1a, DL2a, and DL3a may be oxidized to form the first to third conductive metal layers DCM1, DCM2, and DCM3 and the first to third metal oxide layers DOM1, DOM2, and DOM3. The fourth pattern layer material layer DL4a after being patterned may be completely oxidized to form the fourth metal oxide layer DOM4. Also, the exposed side surface of the active layer 400 may also be oxidized to form an oxide layer on the side surface of the active layer 400.

In addition, the active layer may be partially oxidized by being exposed to the high temperature through the heat treatment process. Exposed surface of the active may be oxidized.

Although the first and third pattern layer material layers DL1a and DL3a and the second and fourth pattern layer material layers DL2a and DL4a may include different metals, it may be possible to equalize the oxidation rates of the pattern layer material layers DL1a, DL2a, DL3a, and DL4a by adjusting process parameters such as the temperature, the atmosphere, and the like of the heat treatment process such that the metal oxide layers DOM1, DOM2, DOM3, and DOM4 may be formed to have substantially the same thickness.

Afterward, the fourth metal oxide layer DOM4 may be further etched to expose the third conductive metal layer DCM3 and/or the third metal oxide layer DOM3 to form contact holes H1 and H2, but the etching method is a well-known technique and the detailed description thereof is omitted herein.

However, the method of oxidizing each of the pattern layer material layers DL1a, DL2a, DL3a, and DL4a is not limited thereto, and it may be possible to oxidize the pattern layer material layers DL1a, DL2a, DL3a, and DL4a by soaking in a hydrogen peroxide (H2O2) solution or performing a plasma treatment with oxygen gas.

Hereinafter, other embodiments of a display device and a method of fabricating the display device will be described. In the following embodiments, a description of the same components as those of the above-described embodiment will be omitted or simplified, and differences will be mainly described.

Figure 10:
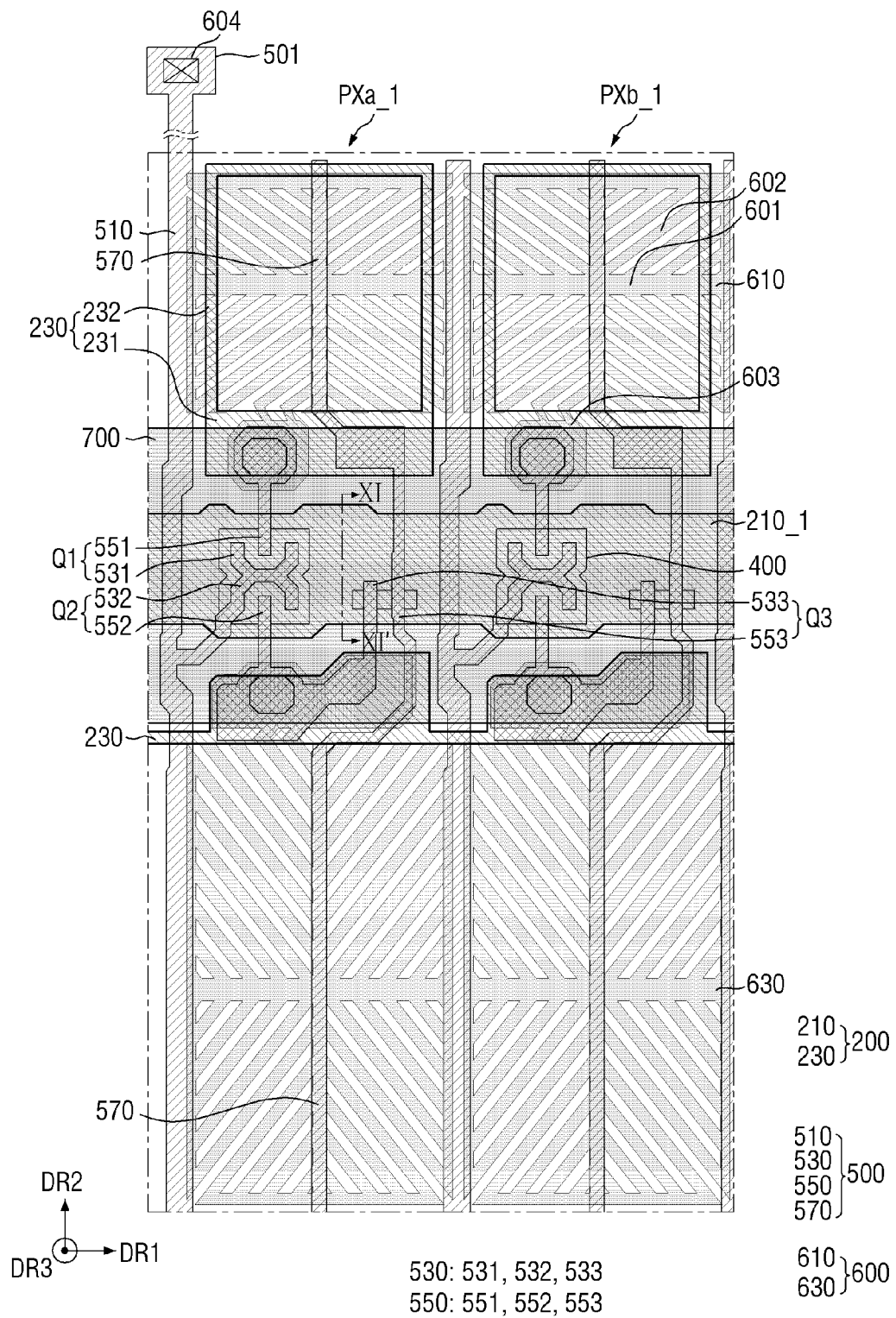
FIG. 10 is a layout view of a pixel included in a display device according to another embodiment.
Figure 11:
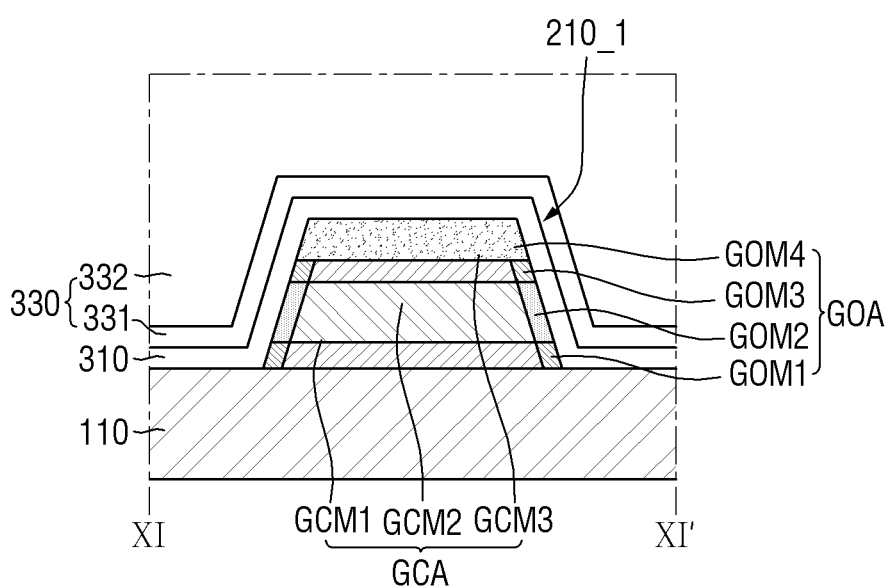
FIG. 11 is a cross-sectional view taken along line XI-XI' of FIG. 10.

FIG. 10 is a layout view of a pixel included in a display device according to another embodiment. FIG. 11 is a cross-sectional view taken along line XI-XI' of FIG. 10.

Referring to FIGS. 10 and 11, this embodiment differs from the embodiment of FIG. 2 in that the first wiring layer 200 of pixels PXa_1 and PXb_1 is substantially identical in layered structure with the second wiring layer 500 of FIGS. 2 to 4. Although the following description is directed to a gate signal wiring 210_1 of the first wiring layer 200 for convenience of explanation, the present disclosure is not limited thereto, and the description may be applicable to other parts of the first wiring layer 200.

In detail, the gate signal wiring 210_1 of the pixels PXa_1 and PXb_1 according to this embodiment may include a conductive area GCA and an oxidized area GOA that differ in electrical conductivity and light reflectance. The conductive area GCA may include a first conductive metal layer GCM1, a second conductive metal layer GCM2, and a third conductive metal layer GCM3. The oxidized area GOA may include a first metal oxide layer GOM1, a second metal oxide layer GOM2, a third metal oxide layer GOM3, and the fourth metal oxide layer GOM4. In addition, the gate signal wiring 210_1 may include a first wiring layer GL1, a second wiring layer GL2, a third wiring layer GL3, and a fourth wiring layer GL4.

The conductive area GCA and oxidized area GOA of the gate signal wiring 210_1, the conductive metal layers GCM1, GCM2, and GCM3, the metal oxide layers GOM1, GOM2, GOM3, and GOM4, and the wiring layers GL1, GL2, GL3, and GL4 may be substantially identical with the conductive area DCA and oxidized area DOA of the second wiring layer 500, the conductive metal layers DCM1, DCM2, and DCM3, the metal oxide layers DOM1, DOM2, DOM3, and DOM4, and the pattern layers DL1, DL2, DL3, and DL4, respectively.

The detailed descriptions of the respective components have been made above and are omitted hereinbelow.

Even in this case, it may be possible to reduce the external light reflectance of the gate signal wiring 210_1, which may lead to improvement of display quality, and also possible to reduce the external light reflectance of the gate signal wiring 210_1 regardless of the viewing angle, which may lead to further improvement of the display quality of the display device. Furthermore, it may be possible to reduce the external light reflectance of the first wiring layer 200, which may lead to the further improvement of the display quality of the display device.

Figure 12:
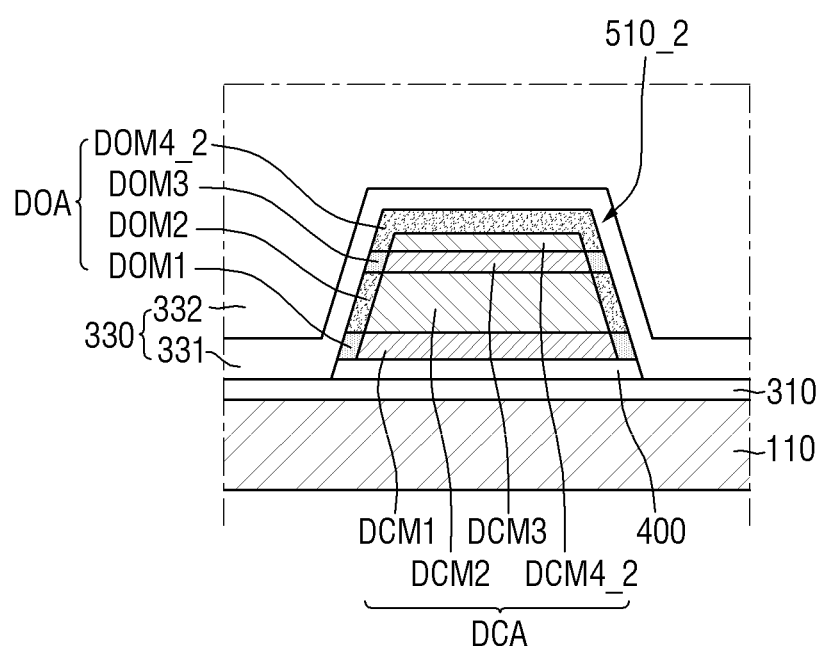
FIG. 12 is a partial cross-sectional view of a display device according to still another embodiment.

FIG. 12 is a partial cross-sectional view of a display device according to still another embodiment. FIG. 12 shows a cross section of a data signal wiring 510_2.

Referring to FIG. 12, this embodiment differs from the embodiment of FIG. 4 in that the fourth pattern layer DL4 of the data signal wiring 510_2 may include a fourth conductive metal layer DCM4_2 as well as a fourth metal oxide layer DOM4_2.

In detail, the data signal wiring 510_2 according to this embodiment may include the first to fourth pattern layers DL1, DL2, DL3, and DL4 and, among them, the first to third pattern layers DL1, DL2, and DL3 may be substantially identical with the first to third pattern layers DL1, DL2, and DL3 of FIG. 4, while the fourth pattern layer DL4 may include the fourth metal oxide layer DOM4_2 and the fourth conductive metal layer DCM4_2.

The conductive area DCA of the data signal wiring 510_2 may include the first to fourth conductive metal layers DCM1, DCM2, DCM3, and DCM4_2, and the fourth conductive metal layer DCM4_2 may be disposed on the third conductive metal layer DCM3. The fourth metal oxide layer DOM4_2 may cover the top and side surfaces of the fourth conductive metal layer DCM4_2. That is, the fourth conductive metal layer DCM4_2 may be surrounded by the fourth metal oxide layer DOM4_2 and the third pattern layer DL3.

Even in this case, it may be possible to reduce the external light reflectance of the second wiring layer 500 (see FIG. 2), which may lead to improvement of display quality, and also possible to reduce the external light reflectance of the second wiring layer 500 (see FIG. 2) regardless of the viewing angle which may lead to further improvement of the display quality of the display device.

Figure 13:
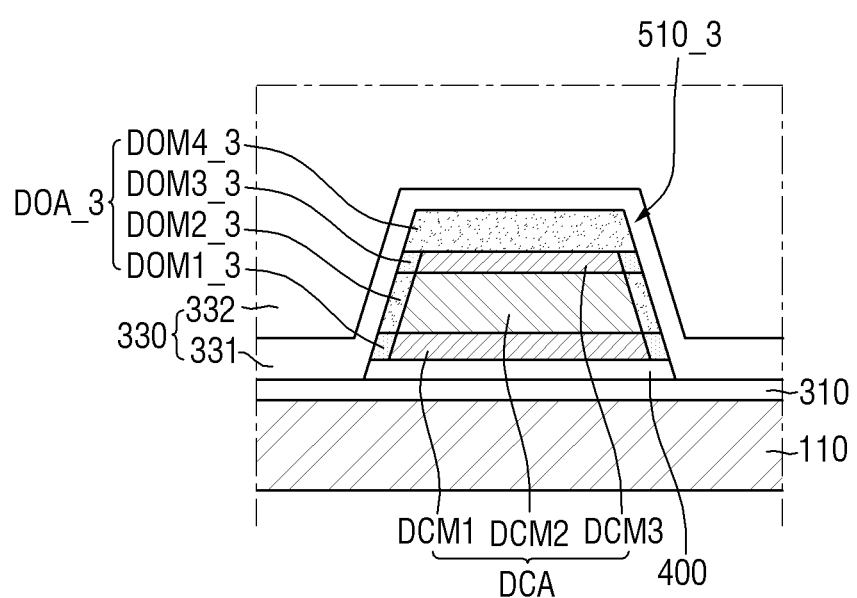
FIG. 13 is a partial cross-sectional view of a display device according to still another embodiment.
Figure 14:
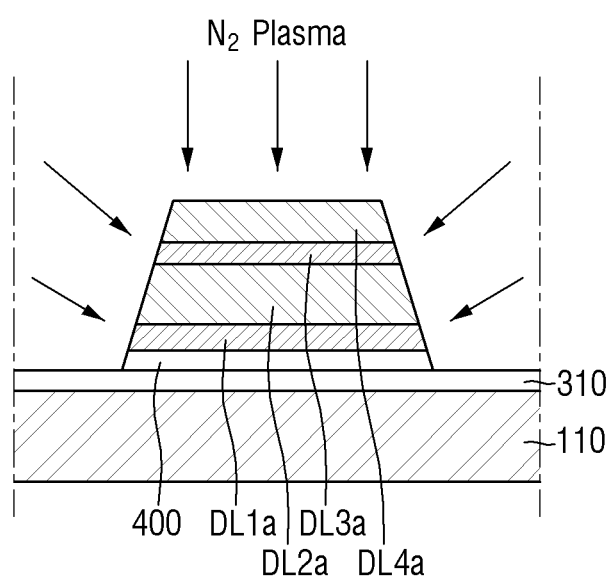
FIG. 14 is a cross-sectional view explaining a method of fabricating the display device of FIG. 13.
Figure 15:
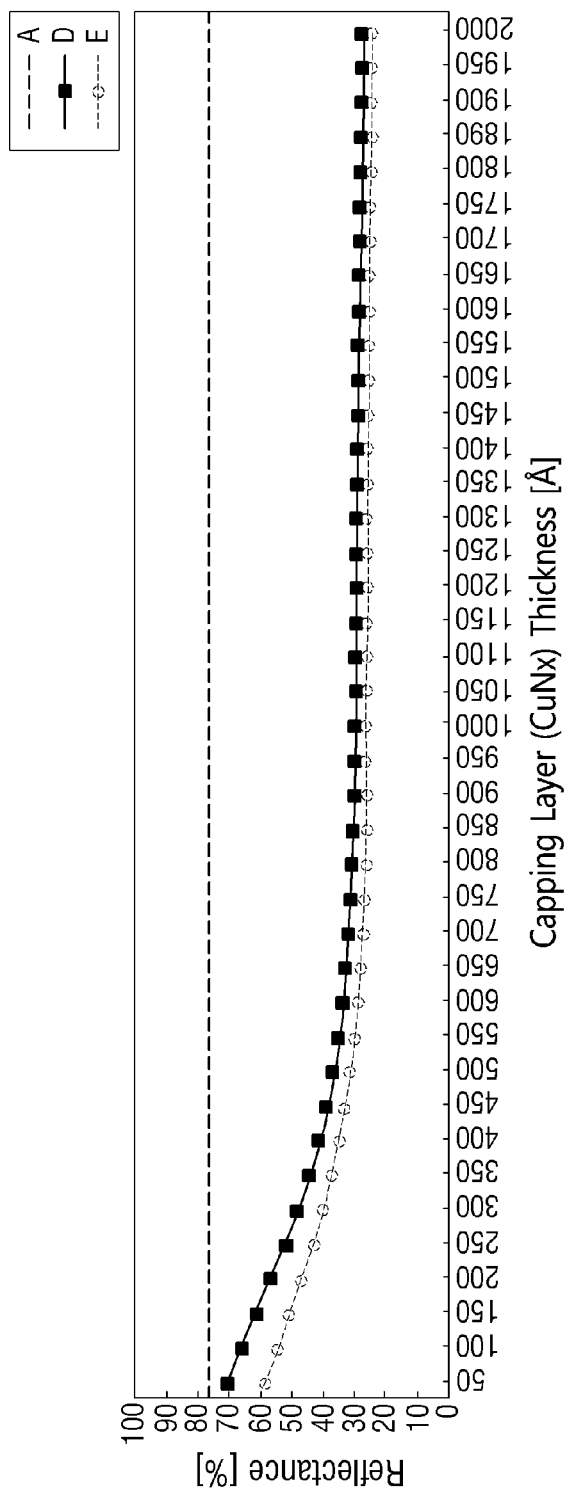
FIG. 15 is graph illustrating an example of a light reflectance in a visible light wavelength band in accordance with a thickness of a fourth metal nitride layer included in the second signal wiring of FIG. 13.

FIG. 13 is a partial cross-sectional view of a display device according to still another embodiment. FIG. 14 is a cross-sectional view explaining a method of fabricating the display device of FIG. 13. FIG. 15 is graph illustrating an example of a light reflectance in a visible light wavelength band in accordance with a thickness of a fourth metal nitride layer included in the second signal wiring of FIG. 13.

FIG. 13 shows a cross section of a data signal wiring 510_3. In the graph of FIG. 15, an X-axis represents the thickness of the fourth metal nitride, and a Y-axis represents the reflectance.

Referring to FIGS. 13 and 14, this embodiment differs from the embodiment of FIG. 4 in that the data signal wiring 510_3 includes a nitrided area DOA_3 including metal nitride layers DOM1_3, DOM2_3, DOM3_3, and DOM4_3.

In detail, the data signal wiring 510_3 according to this embodiment may include a conductive area DCA and a nitrided area DOA_3 that differ in electrical conductivity and light reflectance. The nitrided area DOA_3 may cover the conductive area DCA. The nitrided area DOA_3 may be disposed on the conductive area DCA to cover at least a part of the top surface of the conductive area DCA and/or at least a part of the side surface of the conductive area DCA. The nitrided area DOA_3 may be substantially identical in shape and pattern with the oxidized area DOA of FIG. 4.

The nitrided area DOA_3 may include a first metal nitride layer DOM1_3, a second metal nitride layer DOM2_3, a third metal nitride layer DOM3_3, and a fourth metal nitride layer DOM4_3. The metal nitride layers DOM1_3, DOM2_3, DOM3_3, and DOM4_3 may be substantially identical with the respective metal oxide layers DOM1, DOM2, DOM3, and DOM4 of FIG. 4 in layered structure, shape, and pattern.

The metal nitride layers DOM1_3, DOM2_3, DOM3_3, and DOM4_3 may be formed through a plasma treatment with nitrogen containing gas, but the present disclosure is not limited thereto. That is, according to the fabrication method described with reference to FIGS. 6 and 7, it may be possible to perform a plasma treatment with the nitrogen containing gas after patterning the pattern layer material layers DL1*a*, DL2*a*, DL3*a*, and DL4*a* to form the nitrided area DOA_3 including the metal nitride layers DOM1_3, DOM2_3, DOM3_3, and DOM4_3 as shown in FIG. 13. The nitride may be formed on side surfaces of the patterned active layer too. The plasma treatment may also be performed to the first wiring layer 200 too, thereby the side surface of the first wiring layer 200 is covered by the nitrides.

Referring further to FIG. 15, line A refers to the reflectance when the second wiring layer 500 does not include the metal nitride layers DOM1_3 to DOM4_3, line D refers to the average reflectance of light of a visual light spectrum wavelength when the second wiring layer 500 includes the metal nitride layers DOM1_3 to DOM4_3, and line E refers to the reflectance of light of a wavelength of 550 nm when the second wiring layer 500 includes the metal nitride layers DOM1_3 to DOM4_4. Comparing lines D and E with line A, it can be seen that the external light reflectance decreases when the metal nitride layers are disposed on the top and side surfaces of the second wiring layer 500.

Even when the conductive area DCA is covered by the nitrided area DOA_3, it may be possible to reduce the external light reflectance of the data signal wiring 510_3 (or second wiring layer 500 in FIG. 2). It can be seen that the second wiring layer 500 reflects 77% of the external light in the case of line A while, in the cases of lines D and E, the external light reflectance of the second wiring layer 500 is in the range of 20% to 15% or 18%. That is, as in the cases of lines D and E, when the second wiring layer 500 includes the nitrided area DOA_3, this may dramatically reduce the external light reflectance.

That is, even in this case, it may be possible to reduce the external light reflectance of the second wiring layer 500 (see FIG. 2), which may lead to improvement of display quality, and also possible to reduce the external light reflectance of the second wiring layer 500 (see FIG. 2) regardless of the viewing angle, which may lead to further improvement of the display quality of the display device.

Figure 16:
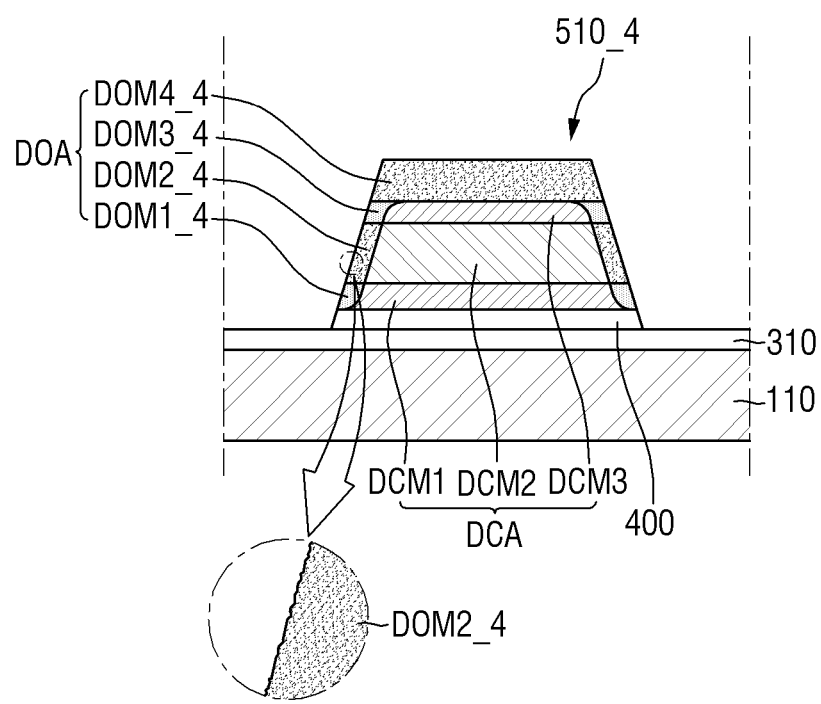
FIG. 16 is a partial cross-sectional view of a display device according to still another embodiment.

FIG. 16 is a partial cross-sectional view of a display device according to still another embodiment.

Referring to FIG. 16, this embodiment differs from the embodiment of FIG. 4 in that the conductive area DCA and the oxidized area DOA constituting the data signal wiring 510_4 are formed to have a boundary of a curved line in cross-sectional view.

In detail, in the data signal wiring 510_4 according to the present embodiment, the first conductive metal layer DCM1 and a first metal oxide layer DOM1_4 may be formed to have a boundary partially curved in cross-sectional view, and the third conductive metal layer DCM3 and a third metal oxide layer DOM3_4 may be formed to have a boundary partially curved in cross-sectional view.

The boundary between the first conductive metal layer DCM1 and the first metal oxide layer DOM1_4 of the data signal wiring 510_4 may have a curved line convex downward at a lower part thereof, and the boundary between the third conductive metal layer DCM3 and the third metal oxide layer DOM3_4 of the data signal wiring 510_4 may have a curved line convex upward at an upper part thereof. The curved line of the boundary in cross-sectional view may be formed due to a difference of exposure to the oxygen gas in the process of oxidizing the patterned pattern layer material layers DL1$a$, DL2$a$, DL3$a$, and DL4$a$ of FIG. 7, but the present disclosure is not limited thereto.

In addition, the metal oxide layers DOM1_4, DOM2_4, DOM3_4, and DOM4_4 may each have an uneven outer surface. Although it is shown in the drawing that only the second metal oxide layer DOM2_4 has the uneven surface, the present disclosure is not limited thereto, and the metal oxide layers DOM1_4, DOM2_4, DOM3_4, and DOM4_4 may each have the surface at least partially including the uneven surface.

That is, even in this case, it may be possible to reduce the external light reflectance of the second wiring layer 500 (see FIG. 2), which may lead to improvement of display quality, and also possible to reduce the external light reflectance of the second wiring layer 500 (see FIG. 2) regardless of the viewing angle, which may lead to further improvement of the display quality of the display device.

Figure 17:
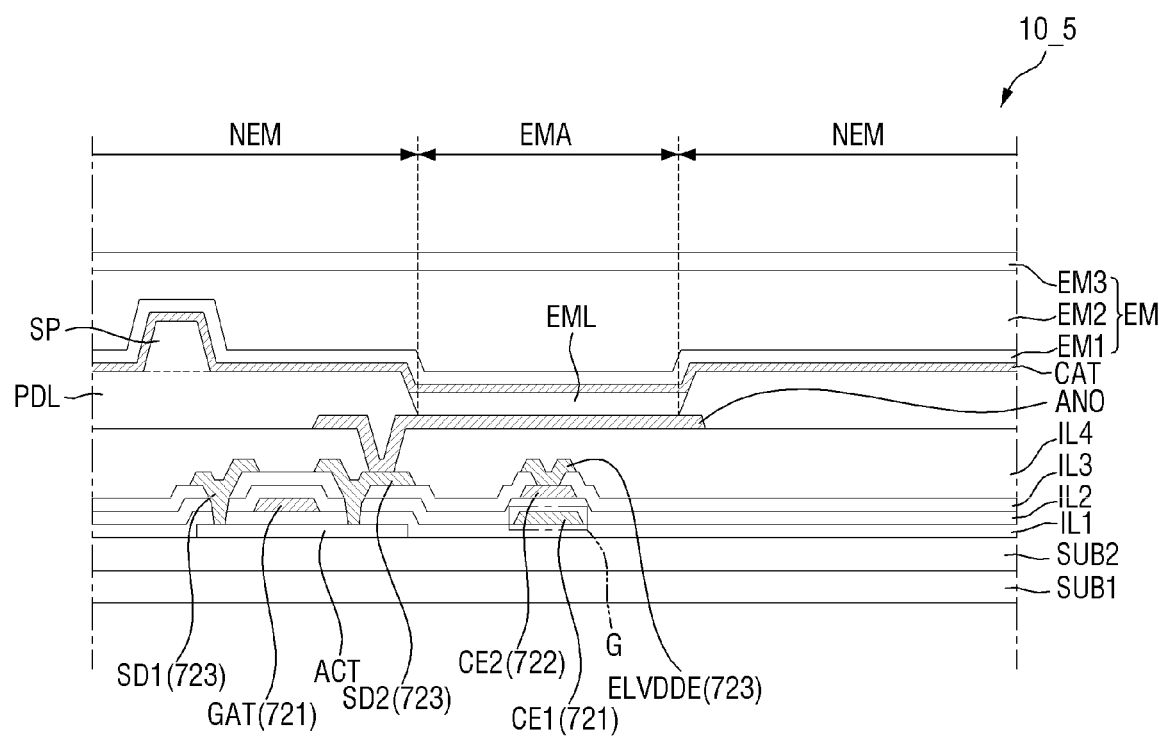
FIG. 17 is a cross-sectional view of a display panel according to still another embodiment.
Figure 18:
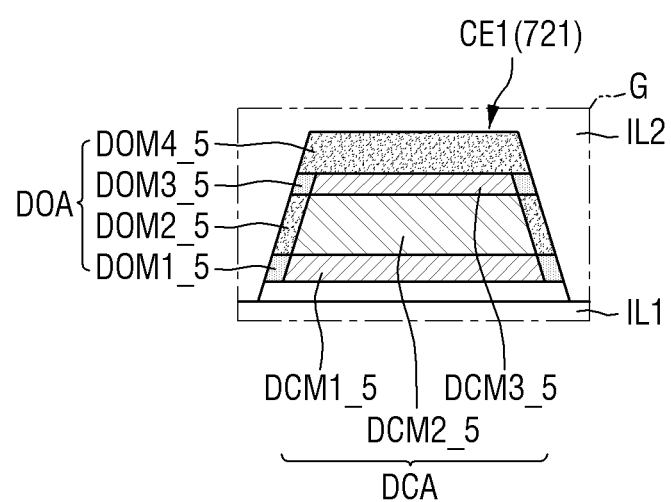
FIG. 18 is an enlarged view enlarging area G of FIG. 17.

FIG. 17 is a cross-sectional view of a display panel according to still another embodiment. FIG. 18 is an enlarged view of an area G of FIG. 17.

Referring to FIGS. 17 and 18, this embodiment differs from the embodiment of FIG. 1 in that a display panel 10_5 is an organic light emitting display panel (OLED).

Although the following description is made under the assumption that the display panel 10_5 according to this embodiment is an organic light emitting display panel as an example of a self-light emitting display panel, the present disclosure is not limited thereto. Examples of the self-light emitting display panel may include an inorganic electroluminescence (EL) display panel, a quantum dot light emitting display (QED) panel, a micro-LED display panel, a nano-LED display panel, a plasma display panel (PDP), a field emission display (FED) panel, and a cathode ray tube (CRT) display panel.

The display panel 10_5 may include a base substrate SUB1, a buffer layer SUB2, a semiconductor layer ACT, a first insulating layer IL1, a first gate conductive layer 721 (or first signal wiring), a second insulating layer IL2, a second gate conductive layer 722 (or second signal wiring), a third insulating layer IL3, a data conductive layer 723 (or third signal wiring), a fourth insulating layer IL4, an anode electrode ANO, a pixel defining layer PDL including an opening exposing the anode electrode ANO, a light emitting layer EML disposed in the opening of the pixel defining layer PDL, a cathode electrode CAT disposed on the light emitting layer EML and the pixel defining layer PDL, and an encapsulation layer EM disposed on the cathode electrode CAT. Each of the layers described above may consist of a single layer, or a stack of multiple layers. Other layers may be further disposed between the layers.

The pixel defining layer PDL may include an opening exposing the anode electrode ANO. Emission areas EMA and non-emission areas NEM may be distinguished by the pixel defining layer PDL and the openings of the pixel defining layer PDL. The light emitting layer EML is disposed on the anode electrode ANO exposed by the pixel defining layer PDL. The light emitting layer EML may include an organic material layer. The organic material layer of the light emitting layer may include an organic light emitting layer. The cathode electrode CAT may be disposed on the light emitting layer EML. The cathode electrode CAT may be a common electrode extended across all the pixels. The anode electrode ANO, the light emitting layer EML and the cathode electrode CAT may constitute an organic light emitting element.

Organic light emitting elements may emit different color lights. For example, each organic light emitting element may emit one of red, blue, and green lights, although not limited thereto.

The first gate conductive layer 721 (or first signal wiring) may be identical in layered structure with the data signal wiring 510 according to the embodiment of FIG. 4. That is, the first gate conductive layer 721 (or first signal wiring) may include a conductive area DCA including conductive metal layers DCM1_5, DCM2_5, and DCM3_5 and an oxidized area DOA including metal oxide layers DOM1_5, DOM2_5, DOM3_5, and DOM4_5. These components may also be identical in arrangement and layered structure with those of the data signal wiring 510 of FIG. 4. Accordingly, detailed descriptions thereof are omitted hereinafter.

In addition, although the description and drawings are directed to the first gate conductive layer 721 (or first signal wiring), the present disclosure is not limited thereto. At least one of the first gate conductive layer 721 (or first signal wiring), the second gate conductive layer 722 (or second signal wiring), and the data conductive layer 723 (or the third signal wiring) may be substantially identical in layered structure with the data signal wiring 510 according to the embodiment of FIG. 4.

Even in this case, it may be possible to reduce the external light reflectance of each of the signal wirings 721, 722, and 723, which may lead to improvement of display quality, and also possible to reduce the external light reflectance of each of the signal wirings 721, 722, and 723 regardless of the viewing angle, which may lead to further improvement of the display quality of the display device.

Figure 19:
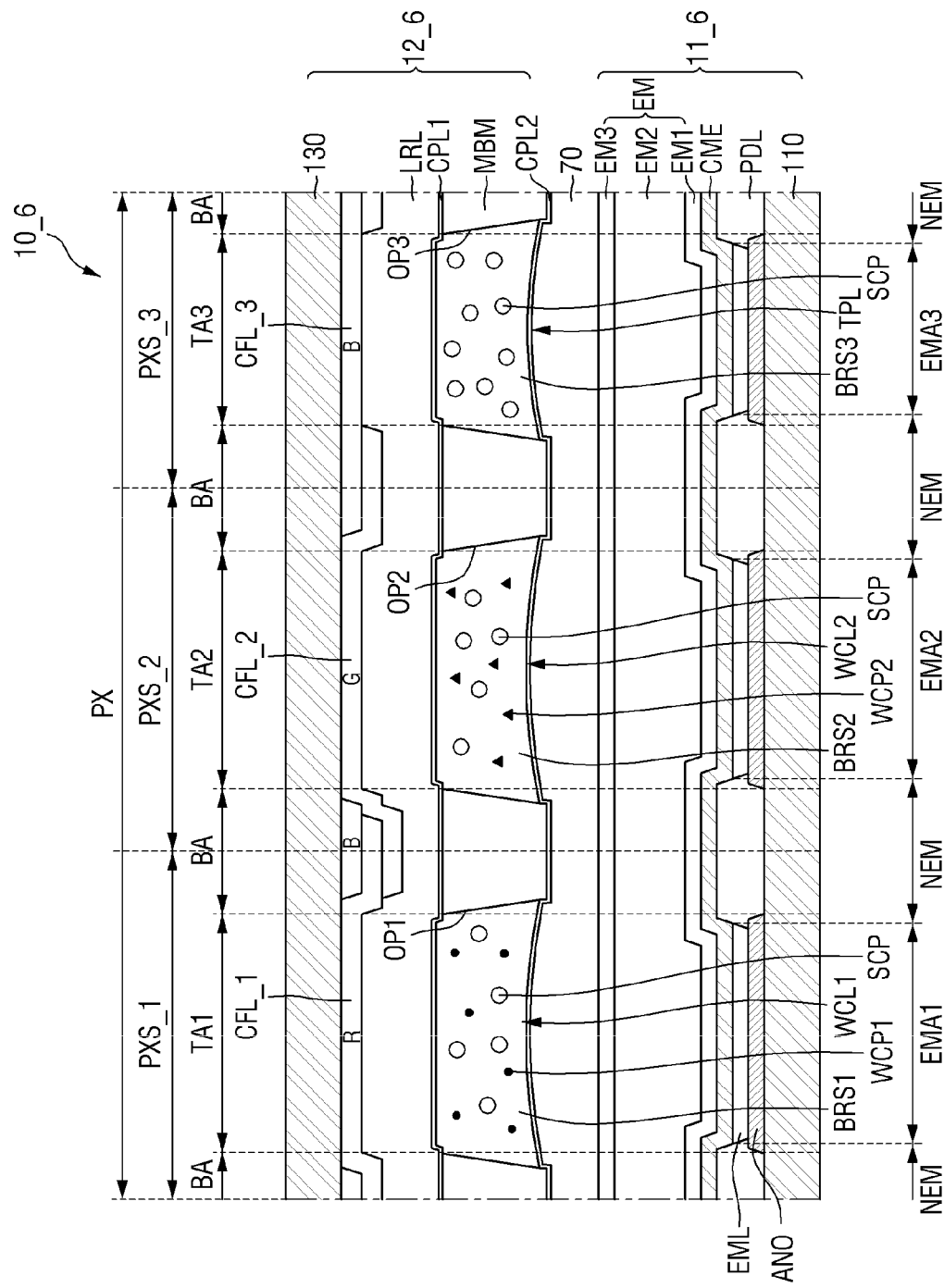
FIG. 19 is a cross-sectional view of a display panel 10_6 according to still another embodiment.

FIG. 19 is a cross-sectional view of a display panel 10_6 according to still another embodiment.

Referring to FIG. 19, this embodiment differs from the embodiment of FIG. 17 in that a display panel 10_6 further includes color control structures converting a color of incident light.

In detail, the display panel 10_6 according to this embodiment may include pixels PX each including a first sub-pixel PXS_1 responsible for emitting red light, a second sub-pixel PXS_2 responsible for emitting green light, and a third sub-pixel PXS_3 responsible for emitting blue light. Each pixel PX may be provided with one first sub-pixel PXS_1, one second sub-pixel PXS_2, and one third sub-pixel PXS_3.

The display panel 10_6 may include a first display substrate 11_6 and a second display substrate 12_6 facing each other and a packed layer 70 filling the space between the first and second display substrates 11_6 and 12_6.

The first display substrate 11_6 may include elements and circuits, e.g., pixel circuits such as switching elements, a pixel defining layer PDL, and self-light emitting elements, for displaying an image. The first display substrate 11_6 may be substantially identical with the display panel 10_5 described with reference to FIGS. 17 and 18. However, the first display panel 11_6 is not limited thereto, and each organic light emitting element (self-light emitting element) may emit blue light.

The second display substrate 12_6 may include color control structures WCL1, WCL2, and TPL for converting the color of the incident light. The color control structures WCL1, WCL2, and TPL may serve to control the wavelength of the incident light and thus convert the color of the incident light.

The second display substrate 12_6 may include a color filter layer CFL for blocking the emission of light of a color different from the corresponding color of each of the sub-pixels PXS, a low refractive layer LRL for recycling at least a part of the light, a first capping layer CPL1, a bank layer MBM delimiting the sub-pixels PXS, wavelength conversion layers WCL1 and WCL2 for converting the wavelength of the light emitted from a light emitting layer EML, a light transmitting layer TPL for directly transmitting the light emitted from the light emitting layer EML, and a second capping layer CPL2.

The wavelength conversion layers WCL1 and WCL2 and the light transmitting layer TPL may include base resins BRS1, BRS2, and BRS3, and scatterers SCP for adjusting an exit angle by scattering light or increasing wavelength conversion efficiency. The wavelength conversion layers WCL1 and WCL2 may further include wavelength conversion materials WCP1 and WCP2 for converting the wavelength of the light.

Even in this case, it may be possible to reduce the external light reflectance of each of the signal wirings included in the display panel 10_6, which may lead to improvement of display quality, and also possible to reduce the external light reflectance of each signal wiring regardless of the viewing angle, which may lead to further improvement of the display quality of the display device.

In concluding the detailed description, those skilled in the art will appreciate that many variations and modifications can be made to the preferred embodiments without substantially departing from the principles of the present disclosure. Therefore, the disclosed preferred embodiments of the inventive concept are used in a generic and descriptive sense only and not for purposes of limitation.

What is claimed is:

1. A display device comprising:
a substrate; and
a wiring layer disposed on the substrate, the wiring layer including a conductive metal layer and a metal compound layer of the conductive metal layer, wherein the metal compound layer surrounds the conductive metal layer;
wherein the wiring layer includes a first conductive metal layer, a second conductive metal layer, a third conductive metal layer, and a first metal compound layer which are sequentially disposed on the substrate,
wherein the first conductive metal layer and the third conductive metal layer include a first metal, the second conductive metal layer includes a second metal different from the first metal, and the first metal compound layer includes the second metal,
wherein the first metal compound layer covers a top surface of the third conductive metal layer, and
wherein the first metal is titanium (Ti), the second metal is copper (Cu), and the first metal compound is at least one of copper oxide (CuOx) or copper nitride (CuNx).

2. The display device of claim 1, wherein the first metal compound layer has a light reflectance lower than that of the first conductive metal layer, the second conductive metal layer, and the third conductive metal layer.

3. The display device of claim 1, further comprising:
a second metal compound layer surrounding a side surface of the first conductive metal layer and having a light reflectance lower than that of the first conductive metal layer, the second metal compound layer including a metal included in the first conductive metal layer;
a third metal compound layer surrounding a side surface of the second conductive metal layer and having a light reflectance lower than that of the second conductive metal layer, the third metal compound layer including a metal included in the second conductive metal layer; and
a fourth metal compound layer surrounding a side surface of the third conductive metal layer and having a light reflectance lower than that of the third conductive metal layer, the fourth metal compound layer including a metal included in the third conductive metal layer.

4. The display device of claim 3, wherein side surfaces of the first metal compound layer, the second metal compound layer, the third metal compound layer, and the fourth metal compound layer are aligned with each other.

5. The display device of claim 4, wherein side surfaces of the first conductive metal layer, the second conductive metal layer, and the third conductive metal layer are aligned with each other.

6. The display device of claim 3, wherein the second metal compound layer and the fourth metal compound layer include at least one of titanium oxide (TiOx) or titanium nitride (TiNx), and the third metal compound layer includes at least one of copper oxide (CuOx) or copper nitride (CuNx).

7. The display device of claim 1, wherein the first metal compound layer has an uneven surface.

8. The display device of claim 1, wherein the wiring layer is a gate line or a data line.

9. The display device of claim 8, further comprising an insulating layer disposed on the wiring layer and including a contact hole, and a pixel electrode disposed on the insulating layer,
wherein the first metal layer exposes at least a part of the third conductive metal layer, and the pixel electrode is in contact with the third conductive metal layer exposed by the contact hole.

10. A display device comprising:
a substrate;
a first wiring layer disposed on the substrate and including a gate signal wiring;

a first insulating layer disposed on the first wiring layer;

a second wiring layer disposed on the first insulating layer and including a data signal wiring, a data pad connected to the data signal wiring, and a drain electrode spaced apart from the data signal wiring;

a second insulating layer disposed on the second wiring layer; and a pixel electrode disposed on the second insulating layer and electrically connected to the drain electrode, wherein the second wiring layer includes a first conductive metal layer and a metal compound layer which includes an oxide or a nitride of the first conductive metal layer and is disposed on the first conductive metal layer, wherein the metal compound layer has a reflectance lower than that of the first conductive metal layer, and wherein the metal compound layer has a resistance higher than that of the first area conductive metal layer;

wherein the first conductive metal layer includes a first conductive metal layer, a second conductive metal layer, and a third conductive metal layer which are sequentially disposed on the substrate, and wherein the metal compound layer includes a first metal compound layer covering a side surface of the first conductive metal layer, a second metal compound layer covering a side surface of the second conductive metal layer, a third metal compound layer covering a side surface of the third conductive metal layer, and a fourth metal compound layer covering a top surface of the third conductive metal layer.

11. The display device of claim 10, wherein the data signal wiring includes the metal compound layer covering a top surface of the first conductive metal layer, the data pad includes the metal compound layer completely exposing a top surface of the first conductive metal layer, and the drain electrode includes the metal compound layer partially exposing a top surface of the first conductive metal layer.

12. The display device of claim 11, wherein the pixel electrode is in contact with the top surface of the first conductive metal layer partially exposed by a contact hole disposed in the metal compound layer.

13. The display device of claim 3, wherein the first conductive metal layer and the third conductive metal layer include titanium (Ti), and the second conductive metal layer includes copper (Cu), and wherein the first metal oxide layer and the third metal oxide layer include at least one of titanium nitride (TiNx) or titanium oxide (TiOx), and the second metal oxide layer and the fourth metal oxide layer include at least one of copper nitride (CuNx) or copper oxide (CuOx).

* * * * *